(12) United States Patent
Lin et al.

(10) Patent No.: US 10,217,702 B2
(45) Date of Patent: *Feb. 26, 2019

(54) SEMICONDUCTOR DEVICE AND METHOD OF FORMING AN EMBEDDED SOP FAN-OUT PACKAGE

(71) Applicant: STATS ChipPAC Pte. Ltd., Singapore (SG)

(72) Inventors: Yaojian Lin, Singapore (SG); Kang Chen, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/167,830

(22) Filed: May 27, 2016

(65) Prior Publication Data

US 2016/0276258 A1 Sep. 22, 2016

Related U.S. Application Data

(63) Continuation of application No. 13/529,918, filed on Jun. 21, 2012, now Pat. No. 9,385,006.

(51) Int. Cl.
*H01L 21/48* (2006.01)
*H01L 23/498* (2006.01)
(Continued)

(52) U.S. Cl.
CPC .... *H01L 23/49827* (2013.01); *H01L 21/4853* (2013.01); *H01L 21/56* (2013.01);
(Continued)

(58) Field of Classification Search
CPC .................................. H01L 23/49827
See application file for complete search history.

(56) References Cited

U.S. PATENT DOCUMENTS 5,239,198 A 8/1993 Lin et al.
5,841,193 A * 11/1998 Eichelberger ....... H01L 23/5389
257/723

(Continued)

FOREIGN PATENT DOCUMENTS

CN 2461240 Y 11/2001
CN 2475142 Y 1/2002
(Continued)

*Primary Examiner* — Eugene Lee
(74) *Attorney, Agent, or Firm* — Robert D. Atkins; Patent Law Group: Atkins and Associates, P.C.

(57) ABSTRACT

A semiconductor device includes a BGA package including first bumps. A first semiconductor die is mounted to the BGA package between the first bumps. The BGA package and first semiconductor die are mounted to a carrier. A first encapsulant is deposited over the carrier and around the BGA package and first semiconductor die. The carrier is removed to expose the first bumps and first semiconductor die. An interconnect structure is electrically connected to the first bumps and first semiconductor die. The BGA package further includes a substrate and a second semiconductor die mounted, and electrically connected, to the substrate. A second encapsulant is deposited over the second semiconductor die and substrate. The first bumps are formed over the substrate opposite the second semiconductor die. A warpage balance layer is formed over the BGA package.

23 Claims, 27 Drawing Sheets

(51) Int. Cl.
*H01L 21/56* (2006.01)
*H01L 23/31* (2006.01)
*H01L 23/00* (2006.01)
*H01L 25/03* (2006.01)
*H01L 25/00* (2006.01)
*H01L 21/78* (2006.01)
H01L 23/538 (2006.01)

(52) U.S. Cl.
CPC ............ *H01L 21/561* (2013.01); *H01L 21/78* (2013.01); *H01L 23/3114* (2013.01); *H01L 23/3121* (2013.01); *H01L 23/3128* (2013.01); *H01L 23/49816* (2013.01); *H01L 23/49822* (2013.01); *H01L 23/562* (2013.01); *H01L 24/11* (2013.01); *H01L 24/19* (2013.01); *H01L 24/20* (2013.01); *H01L 24/24* (2013.01); *H01L 24/82* (2013.01); *H01L 24/92* (2013.01); *H01L 24/97* (2013.01); *H01L 25/03* (2013.01); *H01L 25/50* (2013.01); *H01L 21/568* (2013.01); *H01L 23/49811* (2013.01); *H01L 23/5389* (2013.01); *H01L 24/05* (2013.01); *H01L 24/13* (2013.01); *H01L 24/16* (2013.01); *H01L 24/27* (2013.01); *H01L 24/32* (2013.01); *H01L 24/45* (2013.01); *H01L 24/48* (2013.01); *H01L 24/73* (2013.01); *H01L 24/81* (2013.01); *H01L 24/83* (2013.01); *H01L 24/85* (2013.01); *H01L 24/94* (2013.01); *H01L 2224/0401* (2013.01); *H01L 2224/04042* (2013.01); *H01L 2224/04105* (2013.01); *H01L 2224/05082* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/06131* (2013.01); *H01L 2224/06133* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/131* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/2101* (2013.01); *H01L 2224/215* (2013.01); *H01L 2224/2401* (2013.01); *H01L 2224/2402* (2013.01); *H01L 2224/245* (2013.01); *H01L 2224/24011* (2013.01); *H01L 2224/27334* (2013.01); *H01L 2224/32225* (2013.01); *H01L 2224/32245* (2013.01); *H01L 2224/45147* (2013.01); *H01L 2224/48091* (2013.01); *H01L 2224/48225* (2013.01); *H01L 2224/48227* (2013.01); *H01L 2224/48245* (2013.01); *H01L 2224/48247* (2013.01); *H01L 2224/48811* (2013.01); *H01L 2224/48824* (2013.01); *H01L 2224/48839* (2013.01); *H01L 2224/48844* (2013.01); *H01L 2224/48847* (2013.01); *H01L 2224/48855* (2013.01); *H01L 2224/73253* (2013.01); *H01L 2224/73265* (2013.01); *H01L 2224/73267* (2013.01); *H01L 2224/81191* (2013.01); *H01L 2224/82101* (2013.01); *H01L 2224/82104* (2013.01); *H01L 2224/82106* (2013.01); *H01L 2224/83132* (2013.01); *H01L 2224/83191* (2013.01); *H01L 2224/83192* (2013.01); *H01L 2224/83856* (2013.01); *H01L 2224/85411* (2013.01); *H01L 2224/85424* (2013.01); *H01L 2224/85439* (2013.01); *H01L 2224/85444* (2013.01); *H01L 2224/85447* (2013.01); *H01L 2224/85455* (2013.01); *H01L 2224/92147* (2013.01); *H01L 2224/92244* (2013.01); *H01L 2224/92247* (2013.01); *H01L 2224/94* (2013.01); *H01L 2224/97* (2013.01); *H01L 2924/00011* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/1815* (2013.01); *H01L 2924/3025* (2013.01); *H01L 2924/3511* (2013.01); *H01L 2924/3512* (2013.01)

(56) References Cited

U.S. PATENT DOCUMENTS

| | | | | |
|---|---|---|---|---|
| 5,844,315 A * | 12/1998 | Melton | ............... | H01L 21/568 257/738 |
| 5,903,049 A * | 5/1999 | Mori | ............... | H01L 23/3107 257/685 |
| 6,400,007 B1 * | 6/2002 | Wu | ............... | H01L 23/3128 257/686 |
| 6,583,503 B2 * | 6/2003 | Akram | ............... | H05K 1/144 257/678 |
| 6,621,172 B2 * | 9/2003 | Nakayama | ............ | H01L 21/563 257/686 |
| 6,664,644 B2 * | 12/2003 | Morozumi | ......... | H01L 23/3114 257/685 |
| 6,747,361 B2 * | 6/2004 | Ichinose | ............... | H01L 22/32 257/723 |
| 6,762,488 B2 * | 7/2004 | Maeda | ............... | H01L 21/568 257/686 |
| 6,781,241 B2 | 8/2004 | Nishimura et al. | | |
| 6,828,665 B2 * | 12/2004 | Pu | ............... | H01L 23/3128 257/686 |
| 7,132,311 B2 | 11/2006 | Akiba et al. | | |
| 7,271,496 B2 * | 9/2007 | Kim | ............... | H01L 23/3114 257/678 |
| 7,288,835 B2 * | 10/2007 | Yim | ............... | H01L 23/3128 257/685 |
| 7,429,786 B2 * | 9/2008 | Karnezos | ............... | H01L 24/97 257/686 |
| 7,453,153 B2 * | 11/2008 | Saita | ............... | H01L 23/50 257/777 |
| 7,498,668 B2 | 3/2009 | Kawabata et al. | | |
| 7,550,832 B2 | 6/2009 | Weng et al. | | |
| 7,557,443 B2 | 7/2009 | Ye et al. | | |
| 7,615,415 B2 | 11/2009 | Kwon et al. | | |
| 7,626,253 B2 * | 12/2009 | Onodera | ............... | H01L 21/568 257/686 |
| 7,750,455 B2 | 7/2010 | Pagaila et al. | | |
| 7,808,113 B2 | 10/2010 | Gallegos | | |
| 7,868,440 B2 * | 1/2011 | Roberts | ............... | H01L 23/3121 257/686 |
| 7,875,966 B2 | 1/2011 | Jeong et al. | | |
| 7,923,295 B2 | 4/2011 | Shim et al. | | |
| 7,994,625 B2 | 8/2011 | Choi et al. | | |
| 8,106,495 B2 * | 1/2012 | Kajiki | ............... | H01L 21/565 257/678 |
| 8,115,293 B2 | 2/2012 | Moon et al. | | |
| 8,120,156 B2 | 2/2012 | Camacho et al. | | |
| 8,158,888 B2 * | 4/2012 | Shen | ............... | H01L 23/3128 174/255 |
| 8,270,176 B2 * | 9/2012 | Pagaila | ............... | H01L 23/3128 361/760 |

(56) References Cited

U.S. PATENT DOCUMENTS

| | | | |
|---|---|---|---|
| 8,294,279 B2 | 10/2012 | Chen et al. | |
| 8,779,601 B2 * | 7/2014 | Gan | H01L 23/3121 257/686 |
| 8,970,049 B2 | 3/2015 | Kamezos | |
| 9,385,006 B2 * | 7/2016 | Lin | H01L 21/56 |
| 2004/0262774 A1 * | 12/2004 | Kang | H01L 21/563 257/777 |
| 2005/0035440 A1 | 2/2005 | Mohammed | |
| 2005/0121764 A1 * | 6/2005 | Mallik | H01L 23/49816 257/686 |
| 2005/0133916 A1 | 6/2005 | Kamezos | |
| 2005/0133932 A1 | 6/2005 | Pohl et al. | |
| 2006/0035409 A1 * | 2/2006 | Suh | H01L 23/3128 438/109 |
| 2006/0220256 A1 | 10/2006 | Shim et al. | |
| 2007/0141751 A1 * | 6/2007 | Mistry | H01L 21/561 438/109 |
| 2008/0017968 A1 * | 1/2008 | Choi | H01L 21/565 257/686 |
| 2008/0029869 A1 * | 2/2008 | Kwon | H01L 23/552 257/686 |
| 2008/0157325 A1 * | 7/2008 | Chow | H01L 23/3128 257/686 |
| 2008/0230887 A1 * | 9/2008 | Sun | H01L 21/565 257/686 |
| 2009/0057861 A1 * | 3/2009 | Park | H01L 23/3128 257/685 |
| 2009/0108428 A1 | 4/2009 | Carson et al. | |
| 2009/0140442 A1 * | 6/2009 | Lin | H01L 21/565 257/778 |
| 2009/0230532 A1 * | 9/2009 | Ko | H01L 25/03 257/686 |
| 2009/0261466 A1 * | 10/2009 | Pagaila | H01L 21/6835 257/686 |
| 2010/0033941 A1 * | 2/2010 | Pagaila | H01L 23/3128 361/809 |
| 2010/0109169 A1 * | 5/2010 | Kolan | H01L 21/486 257/787 |
| 2010/0133704 A1 * | 6/2010 | Marimuthu | H01L 21/565 257/778 |
| 2010/0309704 A1 | 12/2010 | Dattaguru et al. | |
| 2011/0068453 A1 | 3/2011 | Cho et al. | |
| 2011/0133325 A1 | 6/2011 | Moon et al. | |
| 2011/0140263 A1 | 6/2011 | Camacho et al. | |
| 2011/0156250 A1 * | 6/2011 | Goh | H01L 25/16 257/738 |
| 2011/0266652 A1 | 11/2011 | Do et al. | |
| 2011/0278707 A1 | 11/2011 | Chi et al. | |
| 2011/0278736 A1 | 11/2011 | Lin et al. | |
| 2011/0298129 A1 * | 12/2011 | Hong | H01L 23/3135 257/738 |
| 2012/0056329 A1 | 3/2012 | Pagaila et al. | |
| 2012/0273957 A1 * | 11/2012 | Meyer | H01L 21/486 257/773 |
| 2013/0069239 A1 * | 3/2013 | Kim | H01L 23/49827 257/774 |
| 2013/0200528 A1 | 8/2013 | Lin et al. | |

FOREIGN PATENT DOCUMENTS

| | | |
|---|---|---|
| CN | 1438684 A | 8/2003 |
| TW | 201023318 A | 6/2010 |
| TW | 201023332 A | 6/2010 |
| TW | 201114008 A | 4/2011 |
| TW | 201121011 A | 6/2011 |

* cited by examiner

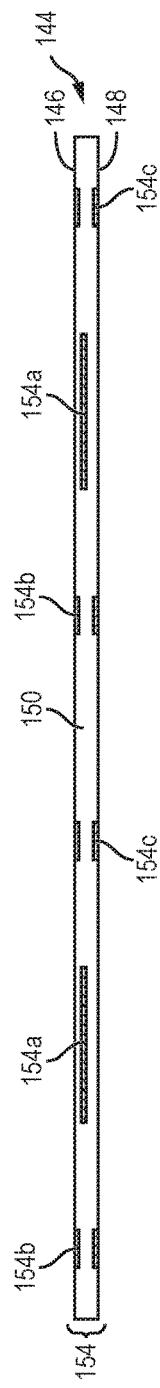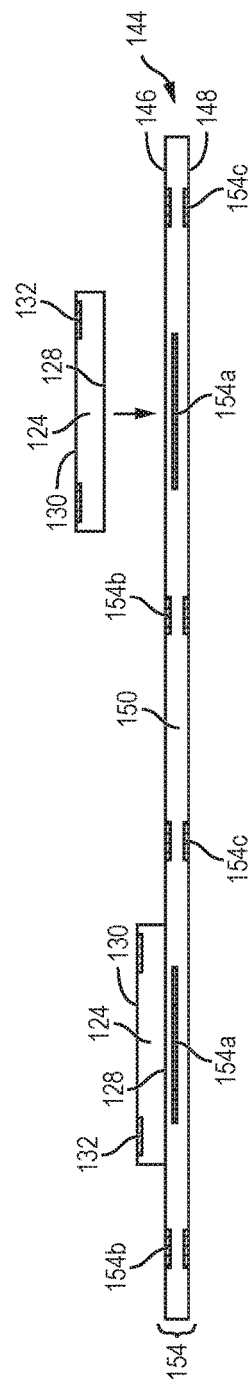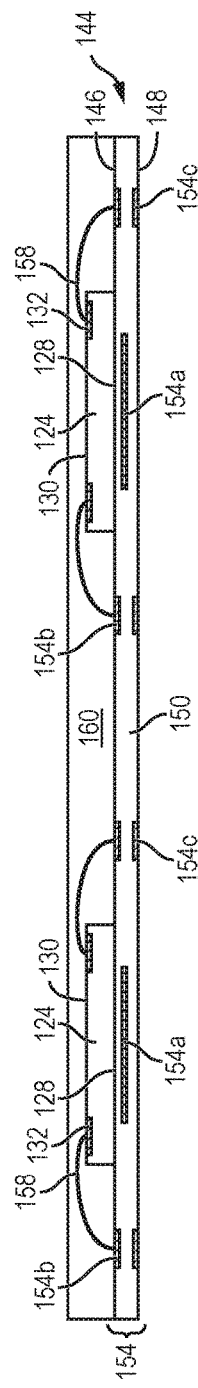

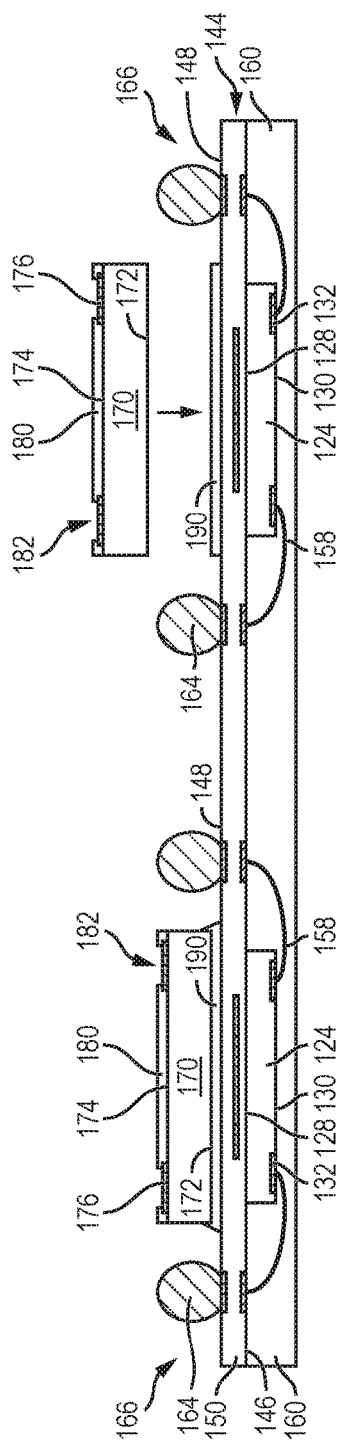
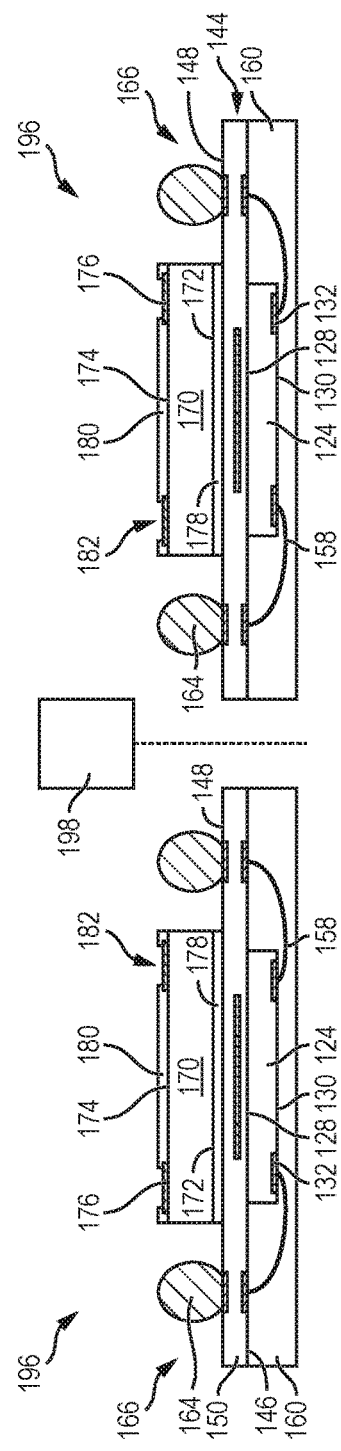

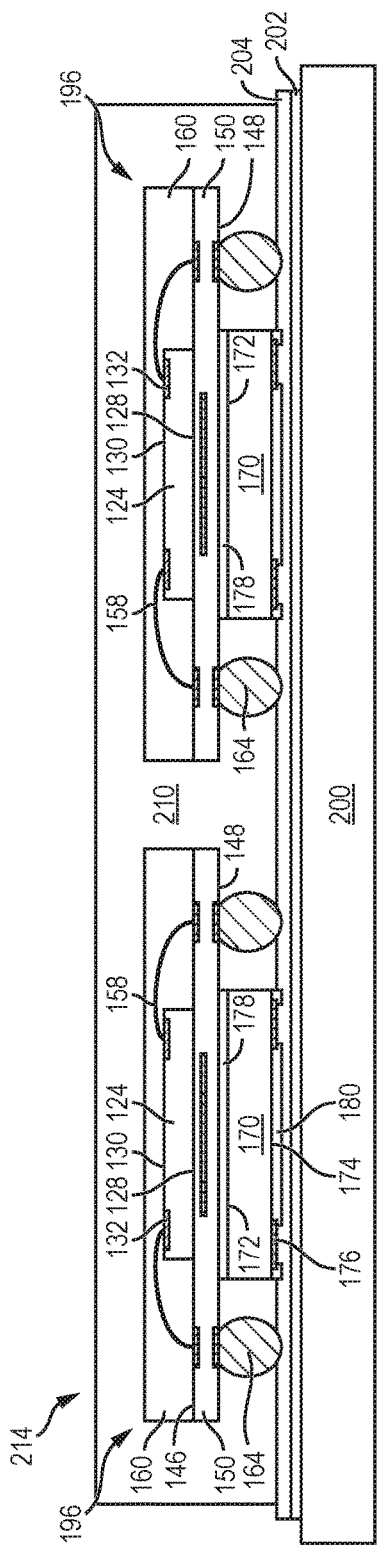
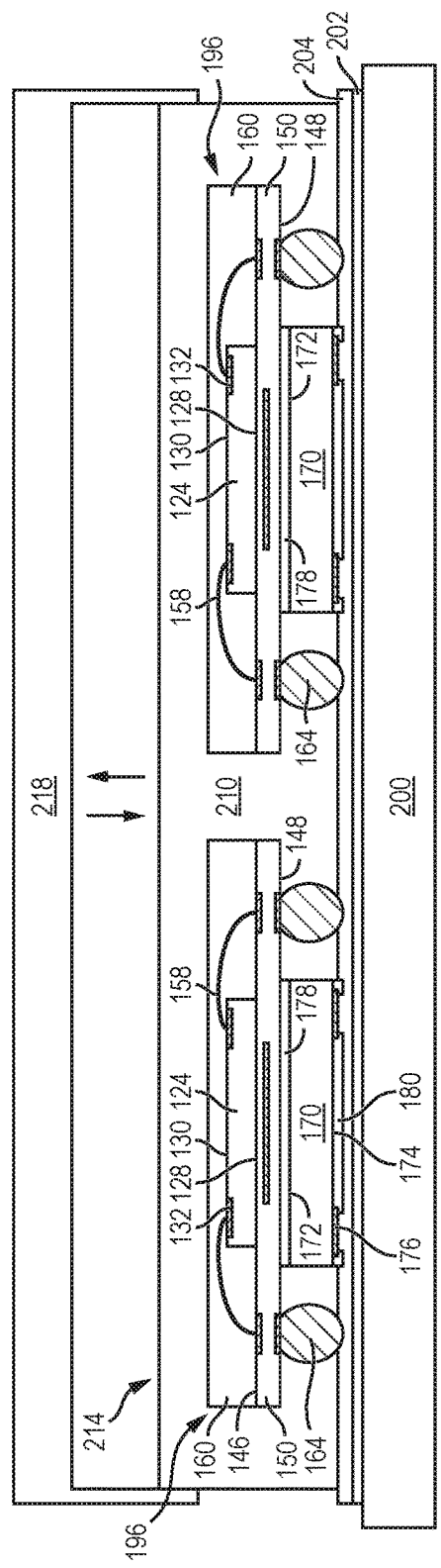
FIG. 5k
FIG. 5l

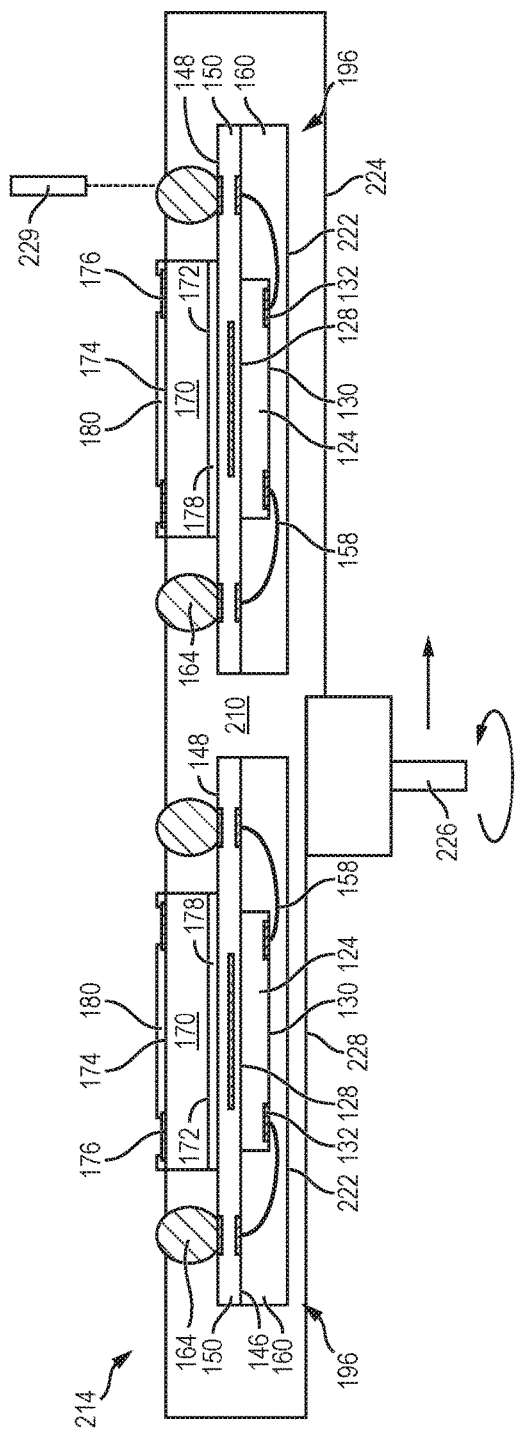
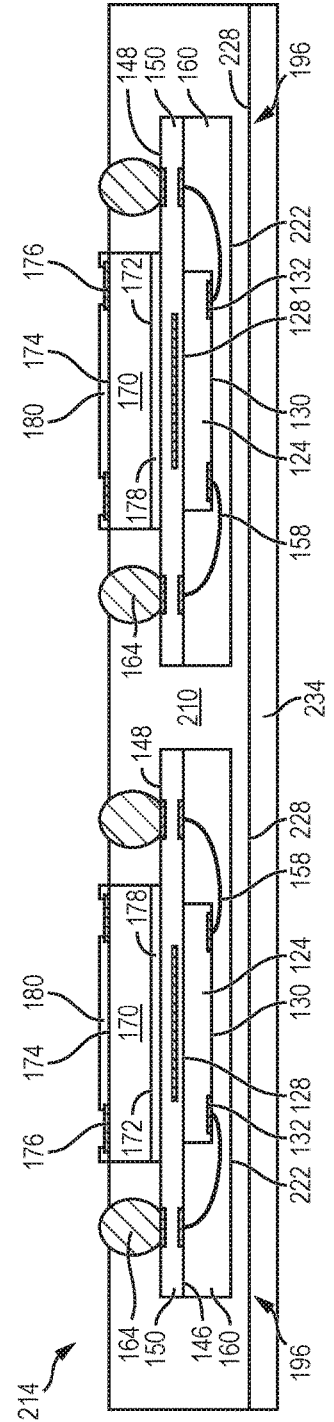

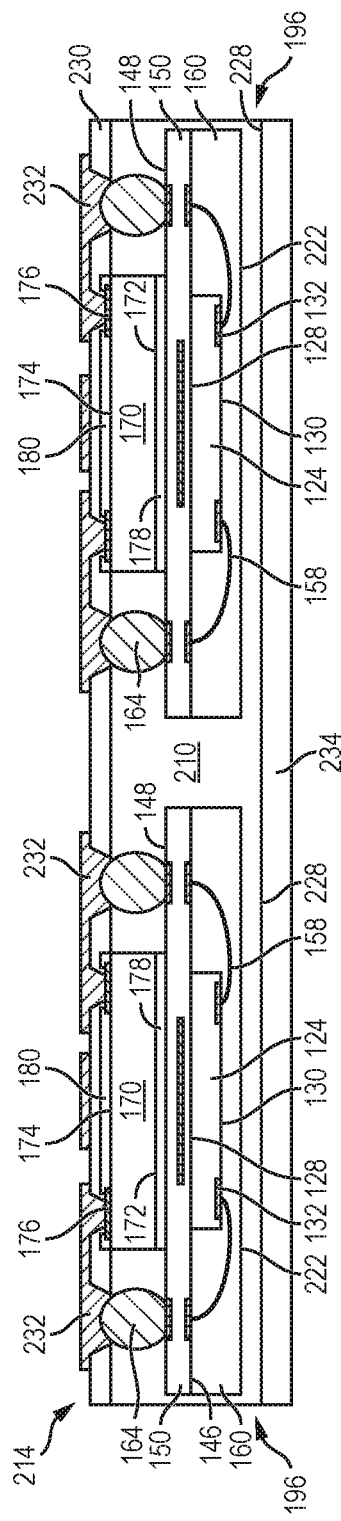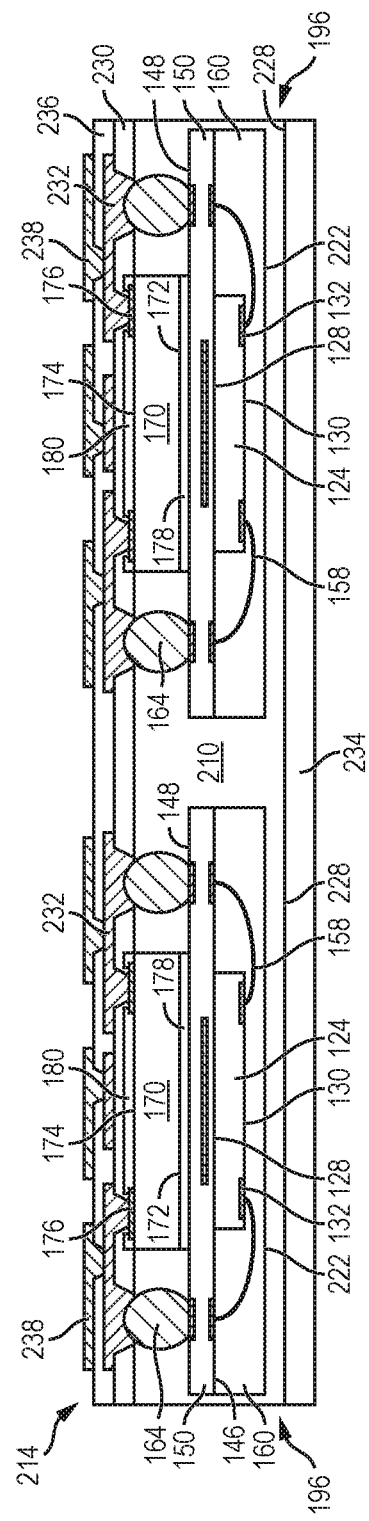

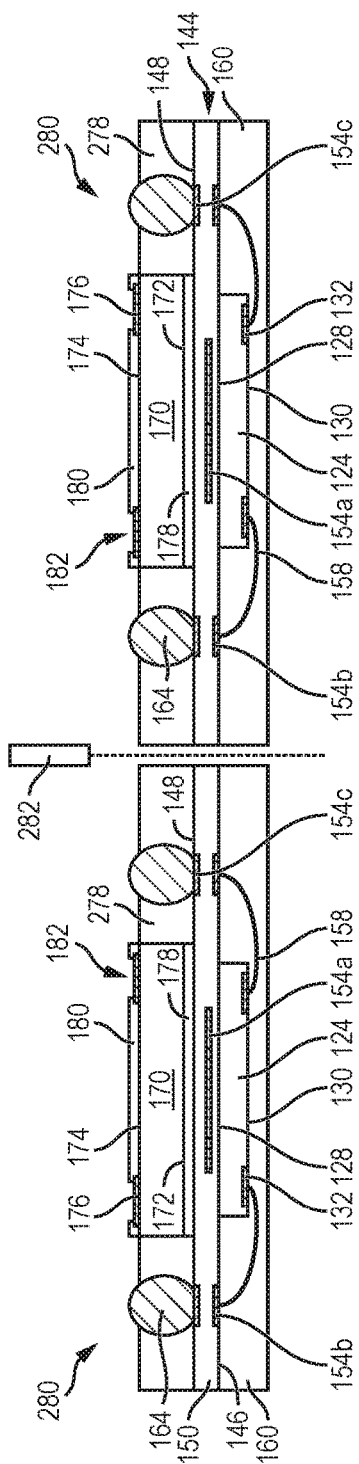
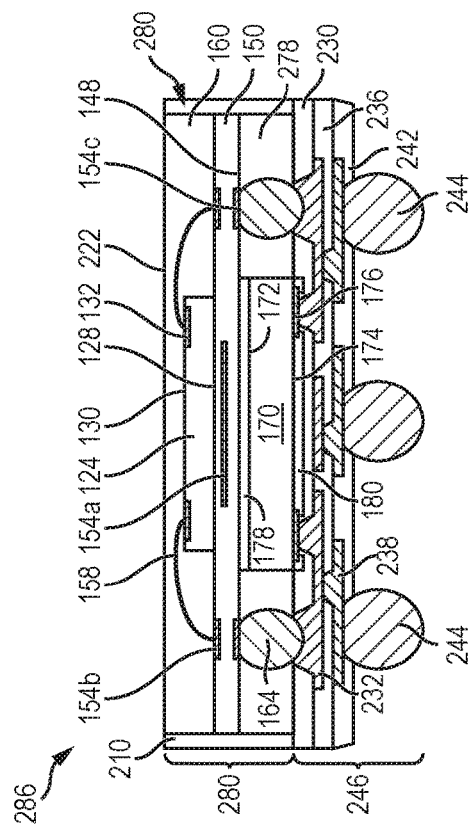
FIG. 11a
FIG. 11b

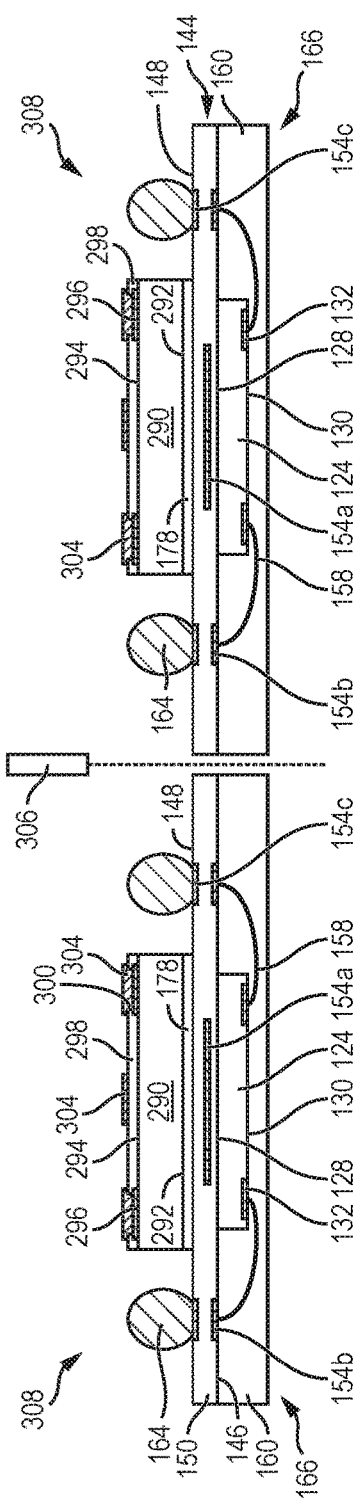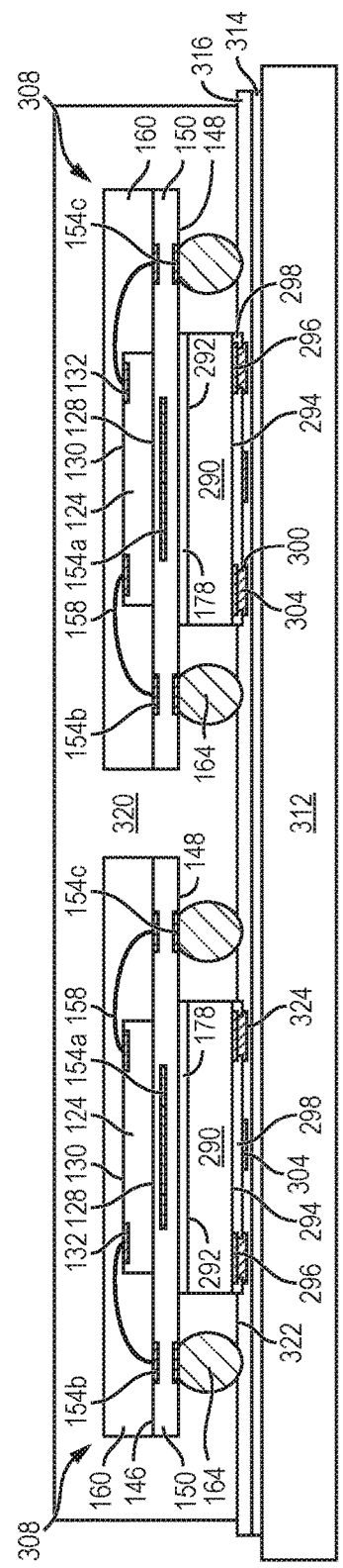
FIG. 12a
FIG. 12b

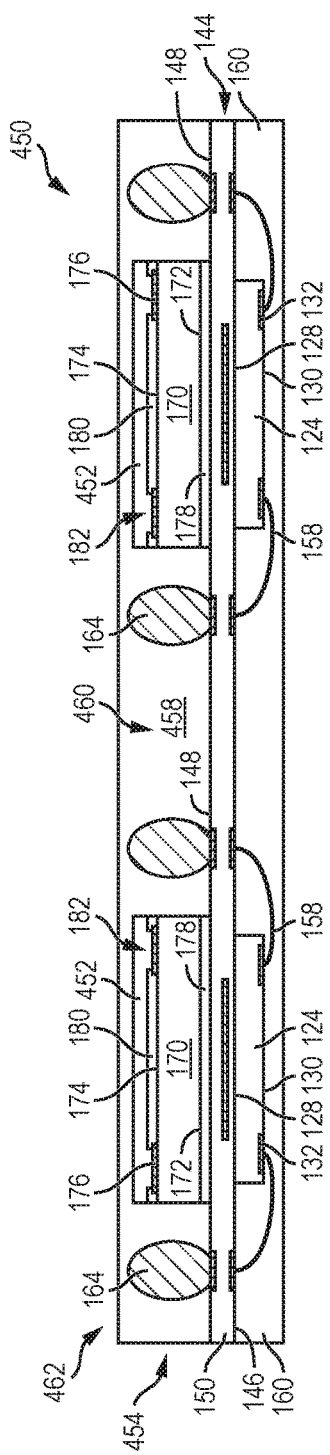
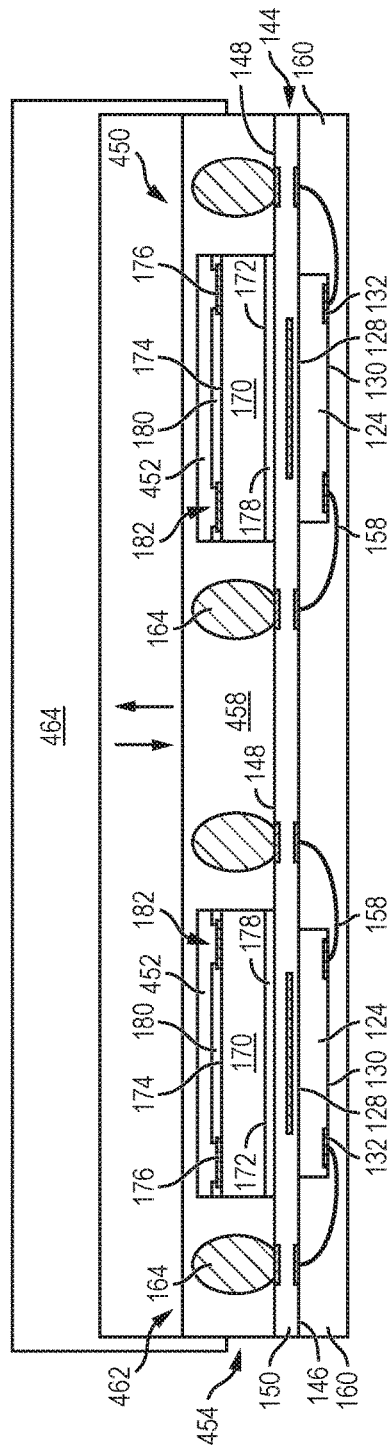
FIG. 19b
FIG. 19c

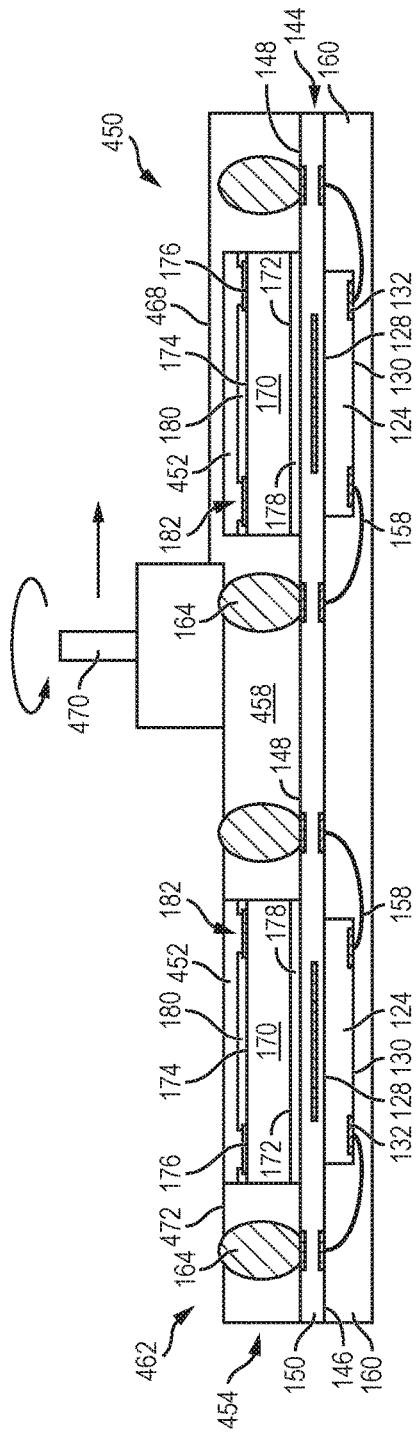
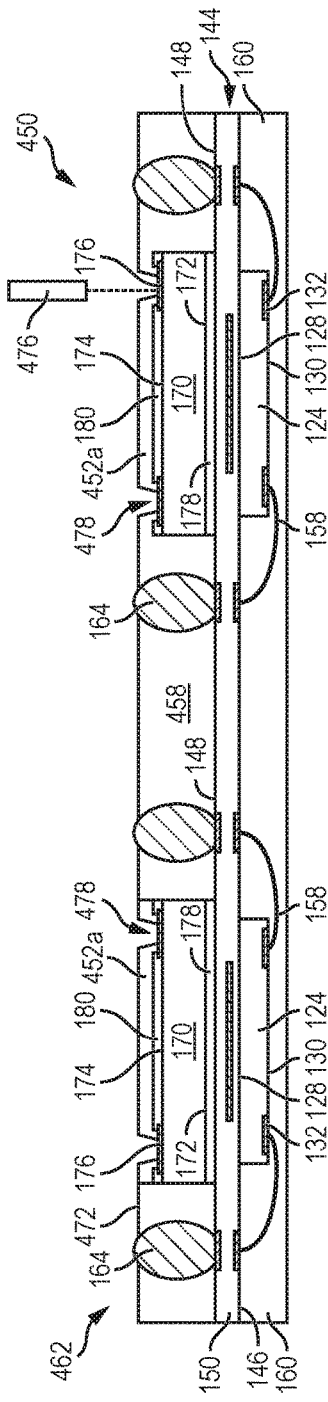

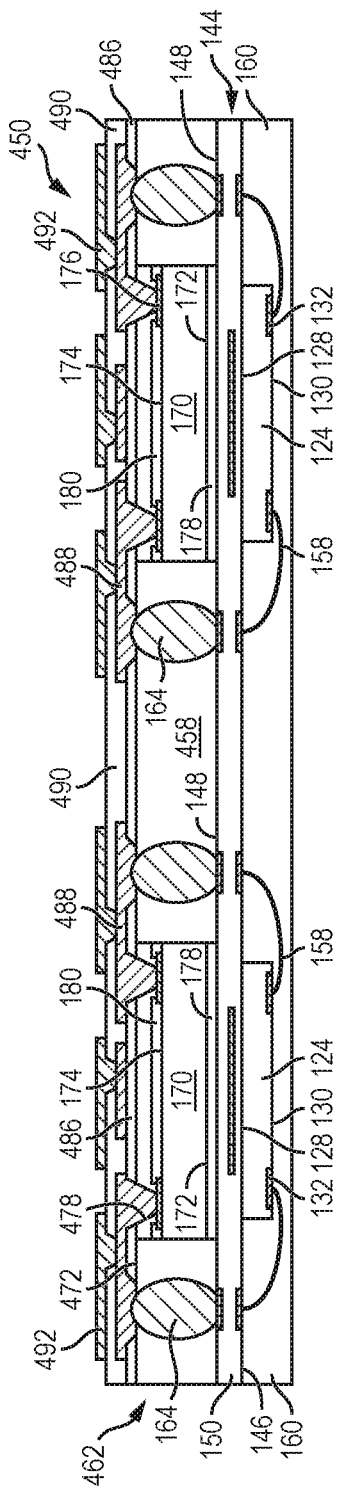
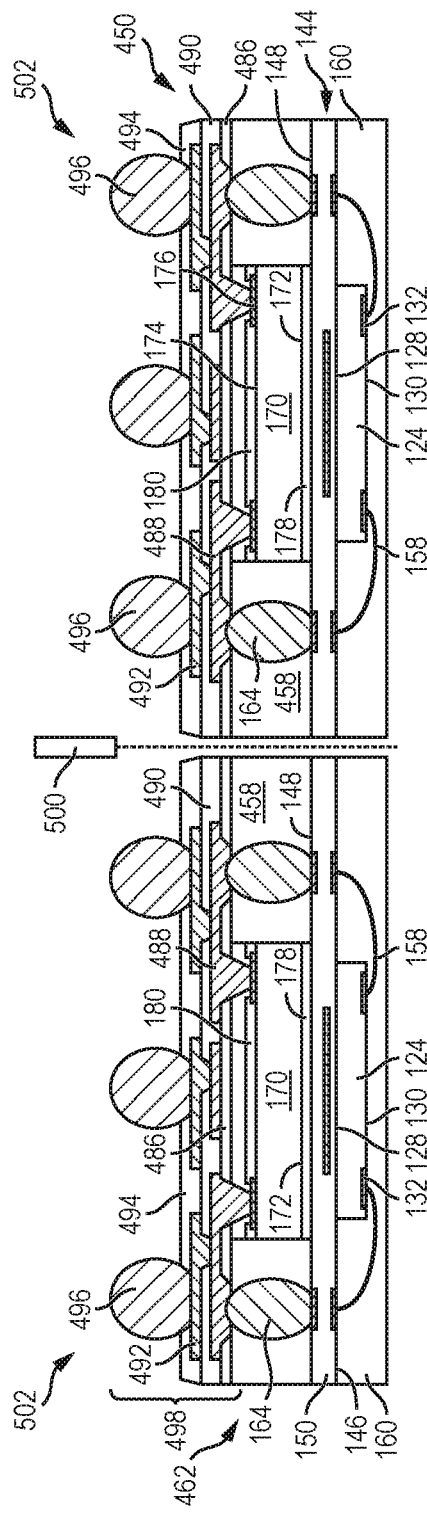
FIG. 19h
FIG. 19i

SEMICONDUCTOR DEVICE AND METHOD OF FORMING AN EMBEDDED SOP FAN-OUT PACKAGE

CLAIM TO DOMESTIC PRIORITY

The present application is a continuation of U.S. patent application Ser. No. 13/529,918, now U.S. Pat. No. 9,385,006, filed Jun. 21, 2012, which application is incorporated herein by reference.

FIELD OF THE INVENTION

The present invention relates in general to semiconductor devices and, more particularly, to a semiconductor device and method of forming a thin embedded silicon (Si) on package (SoP) fan-out package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

The manufacturing of smaller semiconductor devices relies on implementing improvements to horizontal and vertical electrical interconnection between multiple semiconductor devices on multiple levels (3-D device integration). Horizontal electrical interconnections include redistribution layers (RDLs) formed as part of fan-out wafer level chip scale packages (fo-WLCSP) or embedded wafer-level ball grid arrays (eWLB), which provide electrical connection between a semiconductor die and points external the package. Vertical interconnection can be accomplished with conductive through silicon vias (TSV) or through hole vias (THV). However, the use of TSVs and THVs typically involves considerable time and equipment, which reduces the unit-per-hour (UPH) production and increases cost. Furthermore, via formation can include formation of voids that reduce device reliability, and can present problems with semiconductor die placement accuracy and warpage control. One approach to addressing the issues of horizontal and vertical interconnection for 3-D device integration, as known in the prior art, is shown in FIGS. 1a and 1b.

FIG. 1a shows eWLB-molded laser package (MLP) package 10 that uses an interconnect structure 12 including RDLs to provide fan-out horizontal electrical connection for semiconductor die 14. eWLB-MLP package 10 also includes openings 18 formed in encapsulant 20 by laser drilling. Vertical interconnects or conductive bumps 22 are disposed within openings 18 to provide vertical interconnection between interconnect structure 12 and a surface of eWLB-MLP package 10 opposite the interconnect structure without use of TSV or THV. Accordingly, eWLB-MLP package 10 provides horizontal and vertical electrical interconnection with an interconnect I/O array of vertical interconnects 22 formed outside a footprint of semiconductor die 14 for subsequent mounting of additional semiconductor devices or packages to form a 3-D eWLB-MLP package.

FIG. 1b shows a ball grid array (BGA) package or bumped semiconductor device 24 is disposed over eWLB-MLP package 10 from FIG. 1a with bumps 26 disposed over and oriented towards bumps 22. In FIG. 1c, BGA package 24 is mounted with surface mount technology (SMT) to eWLB-MLP package 10 to form a 3-D eWLB-MLP package 28. After mounting BGA package 24 to eWLB-MLP package 10, 3-D eWLB-MLP package 28 is heated to reflow bumps 26 from BGA package 24 and vertical interconnects 22 to form bumps or interconnect structures 30. Thus, 3-D eWLB-MLP package 28 is formed and provides horizontal and vertical interconnection as a 3-D integrated semiconductor device. However, the formation of 3-D eWLB-MLP package 28 requires a complicated process flow that results in a high process cost. The process flow for 3-D eWLB-MLP package 28 is complicated by the formation of openings 18 with laser drilling and the use of two bumping processes. A first bumping process is used to form bumps 26 as part of BGA package 24, and a second bumping process is used to form bumps 22 in openings 18 as shown in FIG. 1*a*, which are subsequently joined to form bumps 30. The formation of 3-D eWLB-MLP package 28 also provides a challenge for handling the package during backside laser drilling and the formation of openings 18 and bumps 30. The mounting of BGA 24 to eWLB-MLP package 10 using SMT introduces additional challenges, such as handling issues and potential wafer damage, that reduce device reliability and package yield. Finally, 3-D eWLB-MLP package 28 offers limited flexibility in controlling an overall height of the package.

SUMMARY OF THE INVENTION

A need exists for a 3-D semiconductor package that provides efficient horizontal and vertical interconnections for the package. Accordingly, in one embodiment, the present invention is a method of making a semiconductor device comprising the steps of providing a semiconductor package including a first semiconductor die and a first encapsulant disposed over the first semiconductor die, disposing a second semiconductor die over the semiconductor package, forming a plurality of bumps over the semiconductor package and around the second semiconductor die, and depositing a second encapsulant over the semiconductor package and around the second semiconductor die and bumps.

In another embodiment, the present invention is a method of making a semiconductor device comprising the steps of providing a first semiconductor die, depositing a first encapsulant over the first semiconductor die, disposing a second semiconductor die over the first semiconductor die, forming a vertical interconnect structure around the second semiconductor die, and depositing a second encapsulant over the first encapsulant and around the second semiconductor die and the vertical interconnect structure.

In another embodiment, the present invention is a method of making a semiconductor device comprising the steps of providing a semiconductor package, disposing a first semiconductor die over the semiconductor package, forming a vertical interconnect structure over the semiconductor package and around the first semiconductor die, and depositing a first encapsulant over the semiconductor package and around the first semiconductor die and the vertical interconnect structure.

In another embodiment, the present invention is a semiconductor device comprising a semiconductor package and first semiconductor die disposed over the semiconductor package. A vertical interconnect structure is formed over the semiconductor package and around the first semiconductor die. A first encapsulant is deposited over the semiconductor package and around the first semiconductor die and the vertical interconnect structure.

BRIEF DESCRIPTION OF THE DRAWINGS

FIGS. 11*a*-11*b* illustrate an embodiment of an embedded SOP fan-out package including multiple encapsulants;

FIGS. 12*a*-12*c* illustrate an embodiment of an embedded SOP fan-out package including a conductive layer disposed over a BGA package;

FIGS. 19*a*-19*i* illustrate another process of forming an embedded SOP fan-out package.

DETAILED DESCRIPTION OF THE DRAWINGS

Figure 1A:
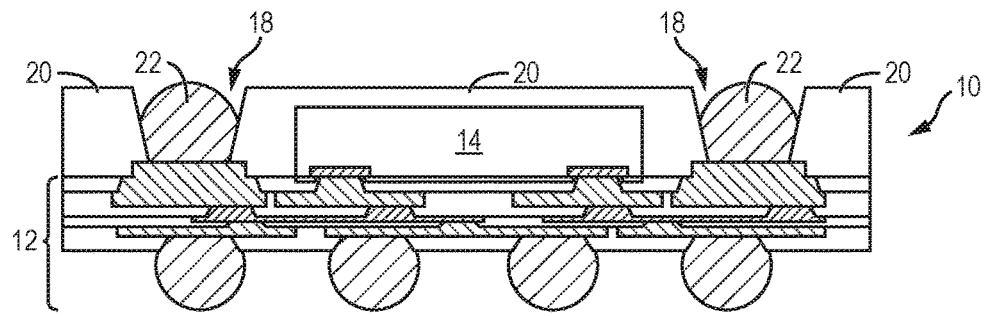
FIGS. 1*a*-1*c* illustrate an eWLB-MLP semiconductor package.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
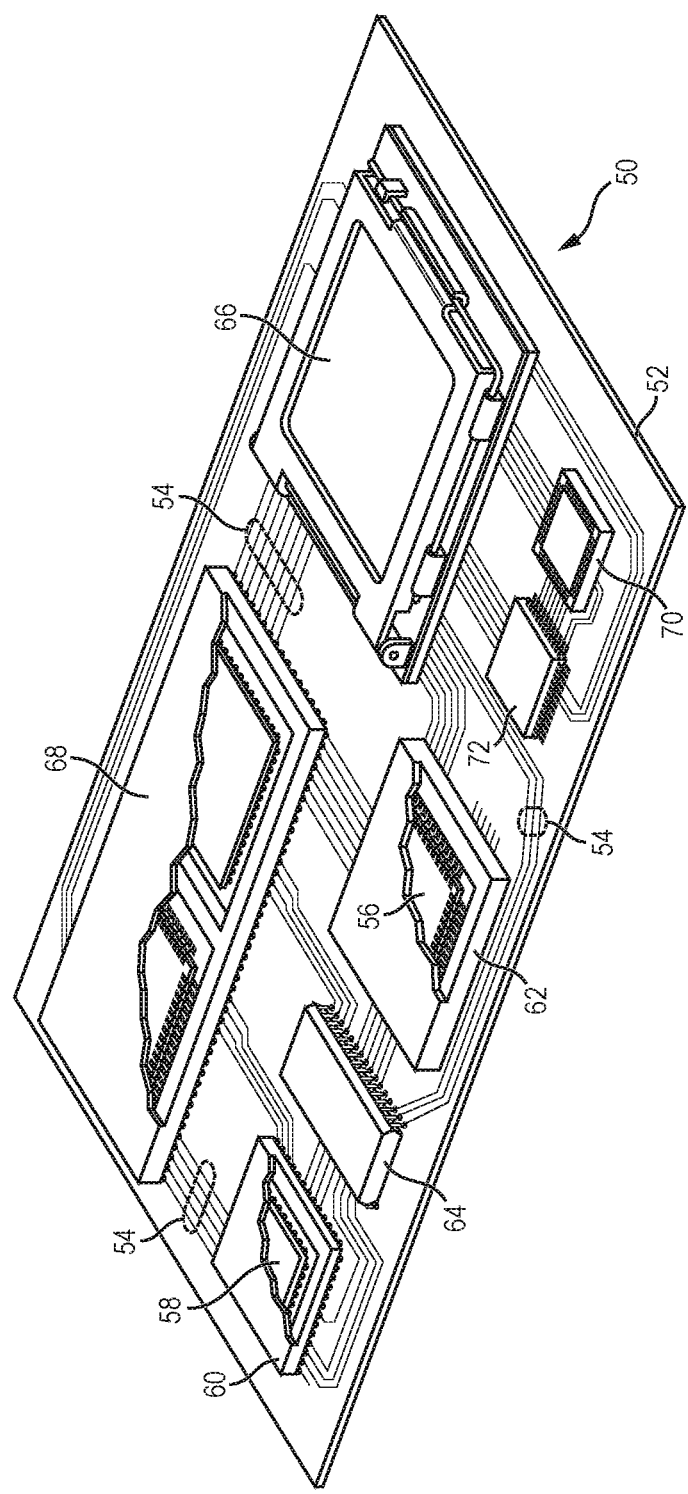
FIG. 2 illustrates a printed circuit board (PCB) with different types of packages mounted to its surface.

FIG. 2 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including BGA 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 3A:
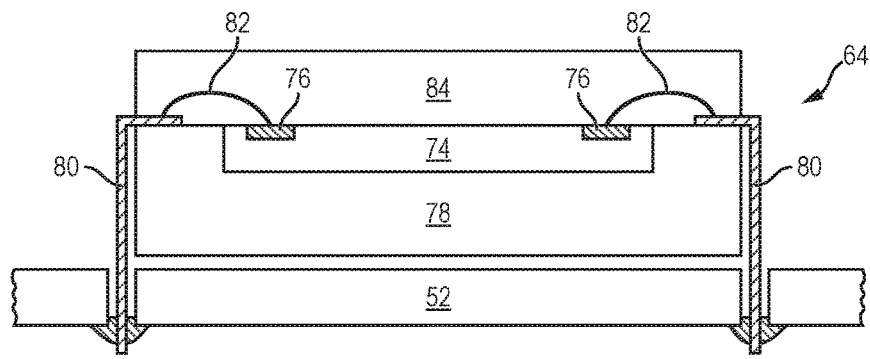
FIGS. 3*a*-3*c* illustrate further detail of the representative semiconductor packages mounted to the PCB.
Figure 3B:
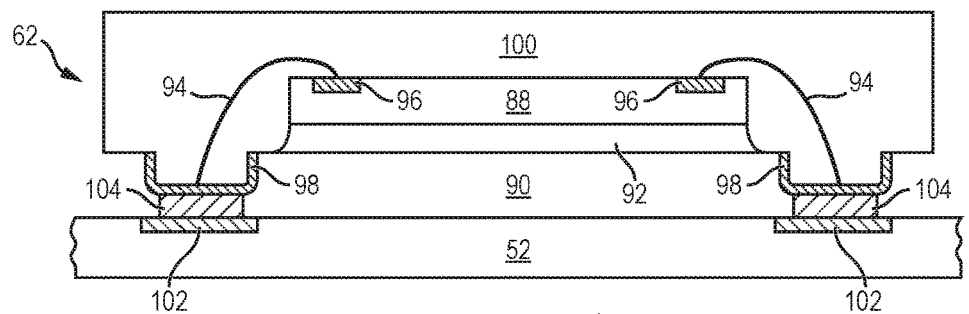
Figure 3C:
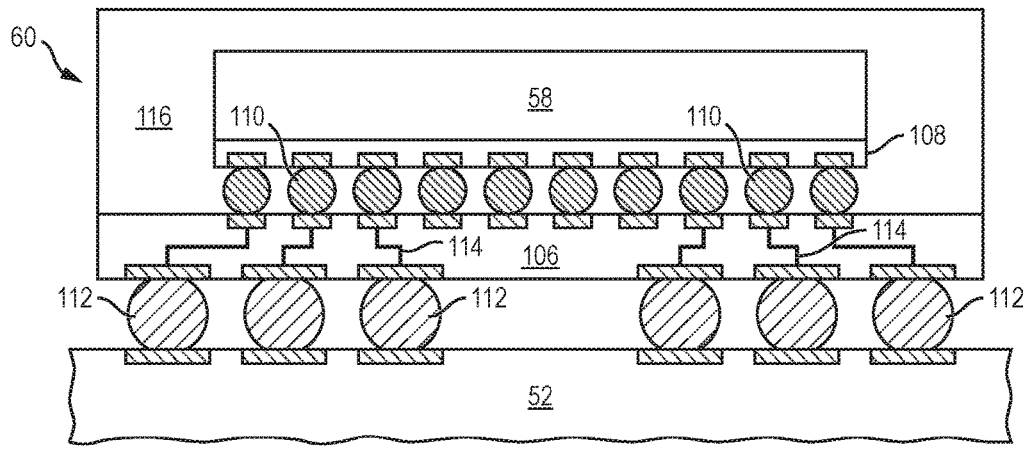

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
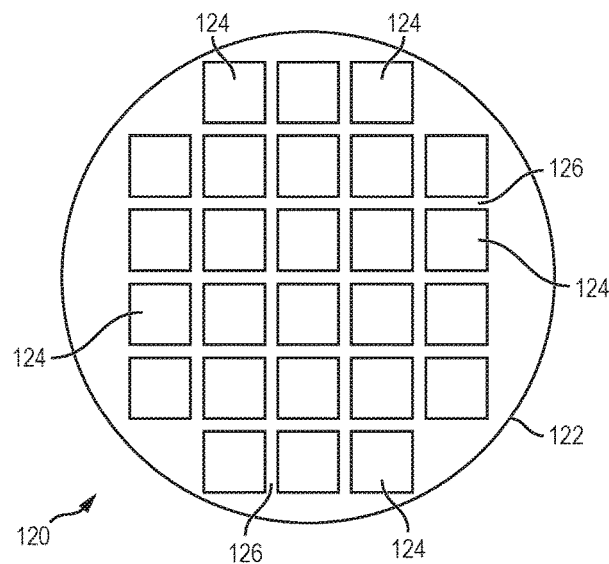
FIGS. 4*a*-4*c* illustrate a semiconductor wafer with a plurality of semiconductor die separated by a saw street.

FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into strips of semiconductor die or individual semiconductor die 124.

Figure 4B:
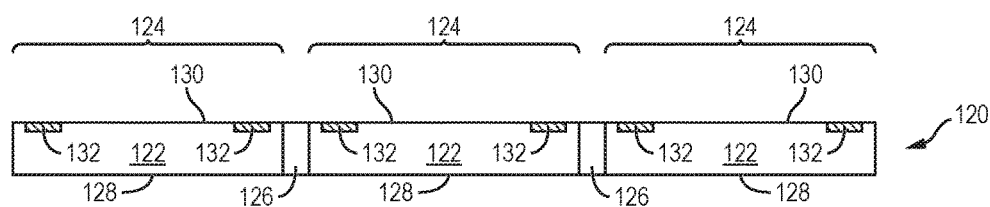

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 4b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Figure 4C:
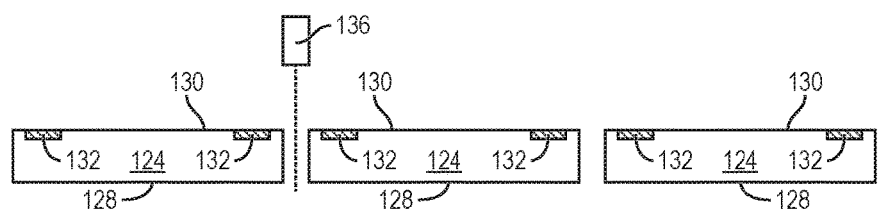

In FIG. 4c, semiconductor wafer 120 is singulated through saw street 126 using a saw blade or laser cutting tool 136 into strips of semiconductor die or individual semiconductor die 124.

Figure 5D:
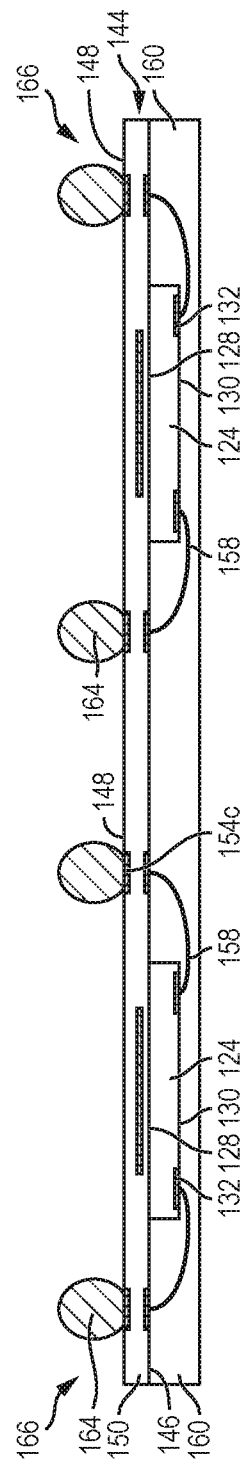
FIGS. 5*a*-5*q* illustrate a process of forming embedded SOP fan-out package.
Figure 5E:
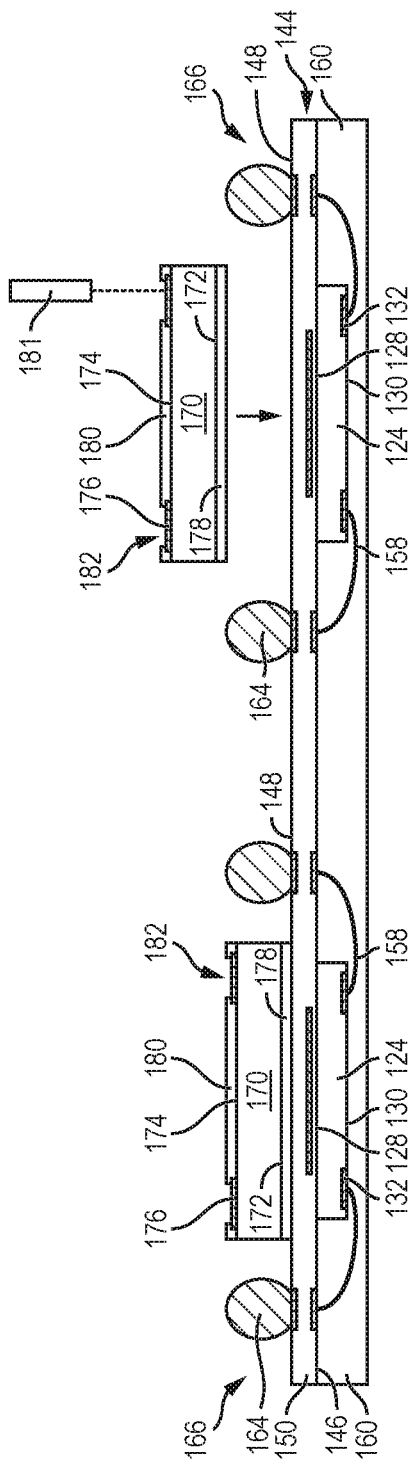
Figure 5H:
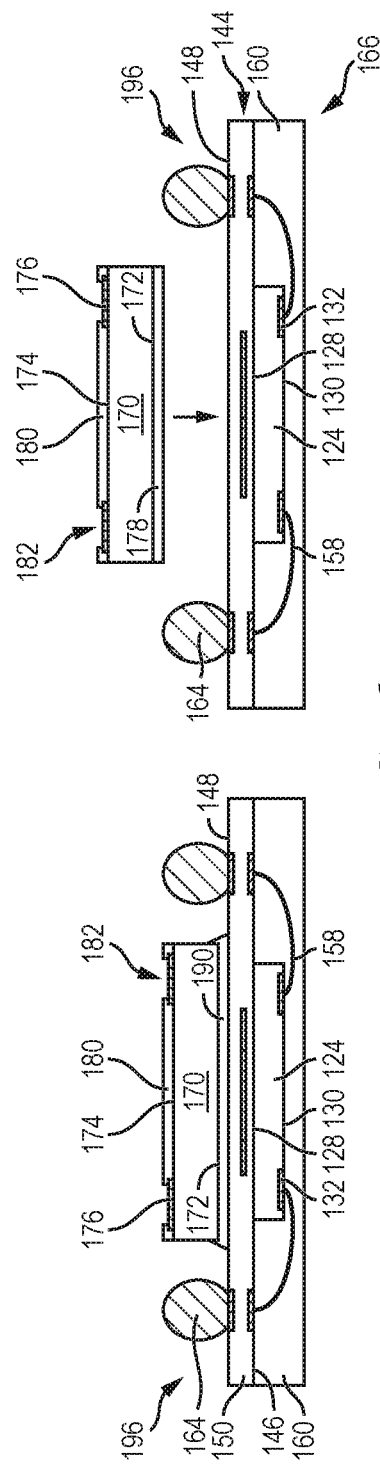
Figure 5I:
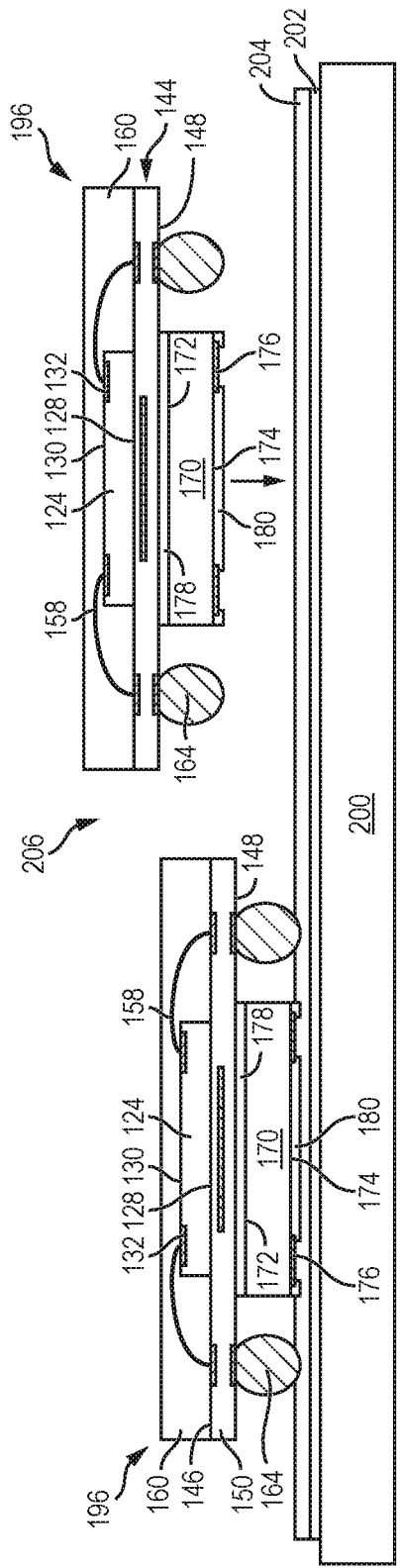
Figure 5J:
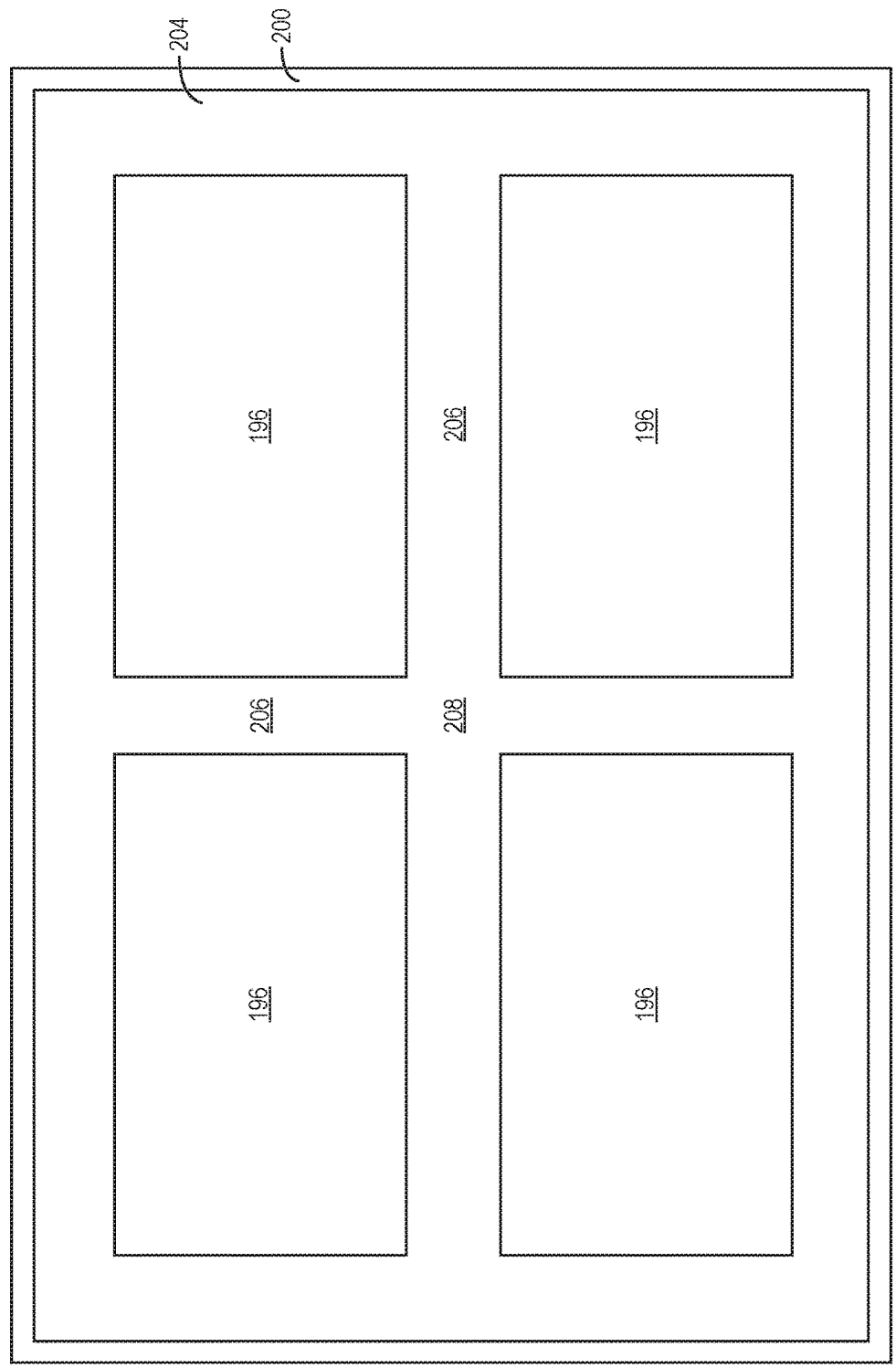
Figure 5Q:
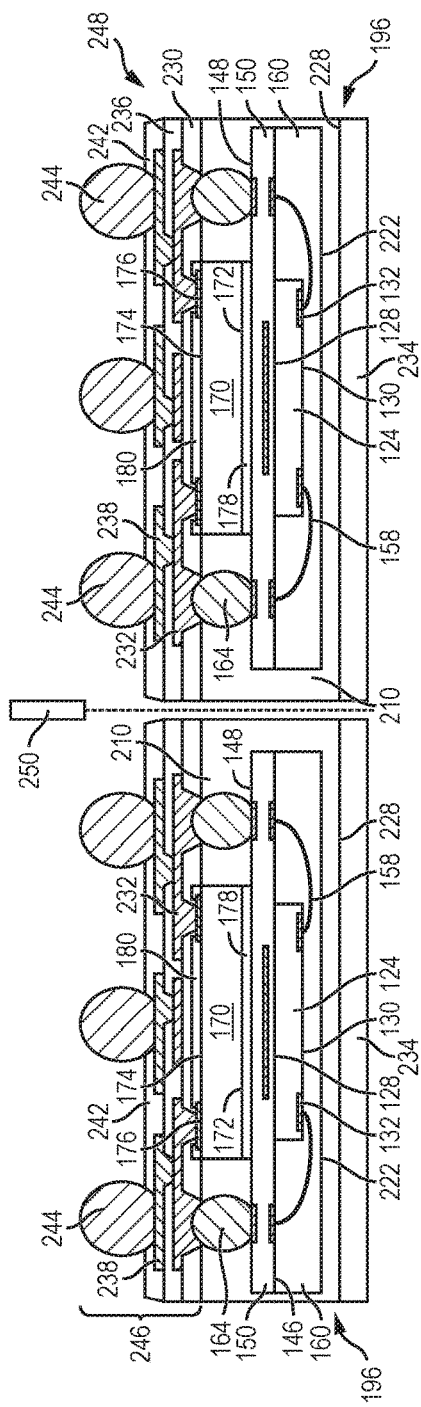

FIGS. 5a-5q illustrate, in relation to FIGS. 2 and 3a-3c, a process of efficiently forming a 3-D SOP fan-out package including horizontal and vertical interconnections. FIG. 5a shows a cross-sectional view of a portion of a substrate or PCB 144 that includes a first surface 146 and a second surface 148 opposite the first surface. Substrate 144 includes structural or base material 150 comprising one or more laminated insulating or dielectric layers such as silicon, germanium, gallium arsenide, indium phosphide, silicon carbide, polymer, polymer composite, ceramic, glass, glass epoxy, beryllium oxide, or other suitable low-cost, rigid material or bulk semiconductor material for structural support. Substrate 144 can also be a multi-layer flexible laminate, ceramic, or leadframe.

An electrically conductive layer or RDL 154 is formed as part of substrate 144 and includes one or more layers of Al, Cu, Sn, Ni, Au, Ag, or other suitable electrically conductive material. Conductive layer 154 includes portion 154a formed within and through substrate 144 to provide electrical interconnection throughout the substrate including vertical electrical interconnect between opposing first and second surfaces 146 and 148, respectively. Conductive layer 154 further includes portion 154b formed on or at first surface 146 that operates as contact pads or trace lines for electrical interconnection between conductive layer 154 and subsequently mounted semiconductor devices. Similarly, conductive layer 154 also includes portion 154c formed on or at second surface 148 that operates as contact pads or trace lines for electrical interconnection between conductive layer 154 and subsequently mounted semiconductor devices. Substrate 144 provides electrical interconnect vertically and laterally across the substrate through conductive layer 154 according to the configuration and design of subsequently mounted semiconductor die. Portions of conductive layer 154 are electrically common or electrically isolated according to the design and function of subsequently mounted semiconductor device.

In FIG. 5b, semiconductor die 124 from FIG. 4c are mounted to substrate 144 with back surface 128 oriented toward first surface 146 of substrate 144. A die attach adhesive or other suitable material is used to attach back surface 128 to first surface 146 of the substrate. Semiconductor die 124 are mounted to substrate 144 with a plurality of contact pads 154b laterally offset and disposed around a periphery of the semiconductor die for subsequent electrical interconnect.

In FIG. 5c, a plurality of bond wires 158 is formed between conductive layers 132 of semiconductor die 124 and contact pads or trace lines 154b. An encapsulant 160 is deposited over and around semiconductor die 124, over substrate 144, and around bond wires 158 using a paste printing, compressive molding, transfer molding, liquid encapsulant molding, vacuum lamination, or other suitable applicator. Encapsulant 160 can be polymer composite material, such as epoxy resin with filler, epoxy acrylate with filler, or polymer with proper filler. In one embodiment, the filler included within encapsulant 160 includes particles with a size less than or equal to about 100 micrometers (μm) at either a liquid, powder, or granular phase. Encapsulant 160 is non-conductive, provides physical support, and environmentally protects the semiconductor device from external elements and contaminants. In one embodiment, encapsulant 160 is deposited using film-assisted molding process.

In FIG. 5d, an electrically conductive bump material is deposited over contact pads 154c using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 154c using a suitable attachment or bonding process. In one embodiment, the bump material is reflowed by heating the material above its melting point to form balls or bumps 164. In some applications, bumps 164 are reflowed a second time to improve electrical contact to contact pads 154c. Bumps 164 can also be compression bonded or thermocompression bonded to contact pads 154c. Bumps 164 represent one type of interconnect structure that can be formed over contact pads 154c. The interconnect structure can also use stud bump, micro bump, conductive columns, composite interconnects, or other electrical interconnect. A height of bumps 164 is determined by a desired final package height as well as other factors. Together, semiconductor die 124, substrate 144, encapsulant 160, and bumps 164 form BGA packages or semiconductor packages 166.

In FIG. 5e, semiconductor die 170, similar to semiconductor die 124 from FIG. 4c, include a back surface 172 and an active surface 174 opposite the back surface. Active surface 174 includes contact pads 176 and an insulating or passivation layer 180 conformally applied over the active surface using PVD, CVD, printing, spin coating, spray coating, sintering or thermal oxidation. Insulating layer 180 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 180 is removed by laser direct ablation (LDA) using laser 181, etching, or other process to form openings 182 in insulating layer 180 to expose contact pads 176. Semiconductor die 170 are mounted to substrate 144 with back surface 172 oriented toward second surface 148 of substrate 144 and with active surface 174 oriented away from substrate 144.

Before semiconductor die 170 are mounted to substrate 144, the semiconductor die optionally undergo a backgrinding process with polishing to remove bulk semiconductor material from back surface 172 to reduce a thickness of the semiconductor die. After backgrinding and optional polishing, a die attach tape or adhesive 178 is disposed over back surface 172 of semiconductor die 170 before the semiconductor die are singulated. Alternatively, die attach tape or adhesive 178 is disposed over back surface 172 of semiconductor die 170 after the semiconductor die are singulated. Semiconductor die 170 are mounted to substrate 144 using a pick and place operation in which proper alignment of the semiconductor die on the substrate is facilitated by the presence of fiducial alignment marks on the substrate of BGA packages 166. Semiconductor die 170 are individually mounted to substrate 144, or alternatively, are mounted to the substrate at a strip level. Semiconductor die 170 are mounted to second surface 148 of substrate 144 with a plurality of bumps 164 laterally offset and disposed around a periphery of mounted semiconductor die 170. In one embodiment, semiconductor die 170 have an area or footprint larger than an area or footprint of semiconductor die 124 such that semiconductor die 124 are disposed within a footprint of semiconductor die 170 over second surface 148 of substrate 144. Alternatively, semiconductor die 170 have an area or footprint equal to or smaller than an area or footprint of semiconductor die 124.

After semiconductor die 170 are mounted to substrate 144, B-stage curing can be applied to semiconductor die 170 and BGA packages 166 to further cure die attach tape or adhesive 178. Additionally, an optimized annealing process may be applied to semiconductor die 170 after the semiconductor die have been mounted to substrate 144 in order to control warpage and maintain acceptable planarity of BGA package 166.

In FIG. 5f, similar to FIG. 5e, semiconductor die 170 are mounted to substrate 144 with back surface 172 oriented toward second surface 148 of substrate 144. Rather than showing die attach tape or adhesive 178 initially disposed over back surface 172 of semiconductor die 170 as in FIG. 5e, FIG. 5f shows die attach adhesive 190 initially disposed over and contacts substrate 144 while being separate from semiconductor die 170. As a bare semiconductor die 170, i.e., without a die attach adhesive, is mounted to substrate 144, adhesive 190 comes in contact with back surface 172 of the semiconductor die as well as side surfaces of the semiconductor die that extend between back surface 172 and active surface 174.

In FIG. 5g, semiconductor die 170 are mounted to BGA packages 166 to form SoP packages 196. SoP packages 196 are singulated through substrate 144, through encapsulant 160, and between bumps 164, semiconductor die 124, and semiconductor die 170 of BGA packages 166 using a saw blade or laser cutting tool 198 to form individual SoP packages 196.

In FIG. 5h, similar to FIGS. 5e-5g, semiconductor die 170 are mounted to substrate 144 with back surface 172 oriented toward second surface 148 of substrate 144. Rather than showing semiconductor die 170 being mounted to unsingulated substrate 144 as in FIGS. 5e and 5f, FIG. 5h shows semiconductor die 170 mounted to substrate 144 opposite semiconductor die 124 after bumps 164 have been mounted to the substrate and after the substrate has been singulated as described above in FIG. 5g. Semiconductor die 170 are mounted to singulated BGA packages 166 either with die attach tape or adhesive 178 initially disposed over back surface 172 of semiconductor die 170 as shown in FIG. 5e, or with die attach adhesive 190 initially disposed over and contacting substrate 144 as shown in FIG. 5f. By mounting semiconductor die 170 to singulated BGA packages 166, the BGA packages can be tested before attachment of the semiconductor die such that the semiconductor die are only mounted to known good BGA packages 166, thereby increasing the yield of SoP packages 196.

FIG. 5i shows a cross sectional view of a portion of temporary substrate or carrier 200 containing sacrificial or recyclable base material such as silicon, steel, polymer, beryllium oxide, or other suitable low-cost, rigid material for structural support. An interface layer or carrier tape 202 is formed or laminated over carrier 200 as a temporary adhesive bonding film and support layer. A thermally releasable layer 204 is formed or laminated on carrier tape 202 and over carrier 200. Thermally releasable layer 204 is configured to receive later mounted SoP packages 196 and to be removed after an encapsulant is deposited around the SoP packages. Alternatively, a single layer of carrier tape or adhesive is formed over carrier 200 instead of using a two layer structure of carrier tape 202 and thermally releasable layer 204.

SoP packages 196 from FIG. 5g or 5h are positioned over carrier 200, carrier tape 202, and thermally releasable layer 204 with active surface 174 of semiconductor die 170 oriented toward the carrier. SoP packages 196 are mounted to carrier 200, carrier tape 202, and thermally releasable layer 204 using a pick and place operation with precise and accurate registration that provides a space or gap 206 between the SoP packages to facilitate the subsequent formation of a fan-out interconnect structure or substrate over the SoP packages. A height of bumps 164 is less than or equal to a combined height of semiconductor die 170 and die attach tape 178 or die attach adhesive 190. Stated another way, a height of semiconductor die 170 is approximately equal to a difference between a height of bumps 164 and die attach tape 178 or die attach adhesive 190. Alternatively, a height of bumps 164 is slightly greater than a combined height of semiconductor die 170 and die attach tape 178 or die attach adhesive 190. In one embodiment, a height of bumps 164 is 10 μm greater than a combined height of semiconductor die 170 and die attach tape 178 or die attach adhesive 190, the height of bumps 164 varying with a thickness of die attach tape 178 or die attach adhesive 190. Accordingly, a portion of bumps 164 is deposited within a thickness of, and surrounded by, a portion of thermally releasable layer 204. Similarly, a portion of semiconductor die 170 including, e.g., insulating layer 180 and contact pads 176 are also deposited within, and surrounded by, a thickness of releasable layer 204 or a single layer of carrier tape or adhesive.

FIG. 5j shows a plan or top view of SoP packages 196 mounted to carrier 200 with thermally releasable layer 204 as described in FIG. 5i. Gaps 206 are disposed around a periphery of SoP packages 196 and are disposed between adjacent SoP packages. FIG. 5j also shows an intersection 208 between two gaps 206 that is formed at corners of four adjacent SoP packages 196.

In FIG. 5k, an encapsulant or molding compound 210 is pre-dispensed or laminated over carrier 200, carrier tape 202, thermally releasable layer 204, as well as over and around SoP packages 196. Alternatively, transfer molding or other suitable process may be used to apply molding compound 210. Encapsulant 210 can be polymer composite material, such as epoxy resin with filler or fiber, epoxy acrylate with filler or fiber, or polymer with proper filler or fiber. In one embodiment, the filler in encapsulant 210 includes particles with a size less than or equal to about 100 µm at either a liquid, powder, or granular phase and is selected to have a content level and characteristics that facilitate the filling of gaps 206 and for filling an area around bumps 164 between BGA packages 166 and carrier 200. The filler in encapsulant 210 is further selected to control warpage and to improve package reliability. Encapsulant 210 is dispensed on thermally releasable layer 204, and in one embodiment is dispensed at a central location on carrier 200, e.g., at intersection 208 of gaps 206 at the corners of four adjacent SoP packages 196. Thus, a reconstituted wafer or fan-out substrate 214 is formed that includes embedded SoP packages 196 and encapsulant 210. SoP packages 196 are embedded together in encapsulant 210, which is non-conductive and environmentally protects the SoP packages from external elements and contaminants.

In FIG. 5l, chase mold 218 is brought together with carrier 200, carrier tape 202, and thermally releasable layer 204 to enclose reconstituted wafer 214 within the mold for encapsulation. Chase mold 218 is brought together with carrier 200, carrier tape 202, and thermally releasable layer 204 by moving chase mold 218 around SoP packages 196 and encapsulant 210, or alternatively, by moving the SoP packages and encapsulant into the mold. In one embodiment, chase mold 218 includes only a first or top portion that is brought together with carrier 200, carrier tape 202, and thermally releasable layer 204 without a second or bottom mold portion. Carrier 200, carrier tape 202, and thermally releasable layer 204 serve as the bottom mold portion for the encapsulation process. Alternatively, semiconductor die SoP packages 196, carrier 200, carrier tape 202, and thermally releasable layer 204 may be disposed within a mold including multiple portions, such as top and bottom portions. After SoP packages 196 and encapsulant 210 are disposed within chase mold 218, the encapsulant can be partially or completely cured. After SoP packages 196 are embedded within encapsulant 210 to form reconstituted wafer 214, the reconstituted wafer is removed from chase mold 218.

In FIG. 5m, reconstituted wafer 214 is removed from chase mold 218. Carrier 200, carrier tape 202, and thermally releasable layer 204 are fully debonded and removed from bumps 164, semiconductor die 170, and encapsulant 210 by activating thermally releasable layer 204. Alternatively, debonding is accomplished by chemical etching, mechanical peeling, CMP, mechanical grinding, thermal bake, UV light, laser scanning, or wet stripping. Removal of carrier 200, carrier tape 202, and thermally releasable layer 204 exposes a surface of encapsulant 210 and further exposes bumps 164, insulating layer 180, and contact pads 176.

In one embodiment, a desired thickness of encapsulant is formed over back surface 222 of SoP package 196, and backgrinding is not required. Alternatively, surface 224 of encapsulant 210 undergoes a grinding operation with grinder 226 to planarize the surface and reduce a thickness of the encapsulant to assist in controlling warpage of SoP packages 196. The grinding operation removes encapsulant 210 to expose a surface 228 of the encapsulant. In one embodiment, surface 228 is vertically offset with respect to back surface 222 of SoP packages 196. Alternatively, surface 228 is coplanar with respect to back surface 222 of SoP packages 196. A chemical etch can also be used to remove and planarize encapsulant 210. While FIG. 5m shows backgrinding of encapsulant 210 occurs before the formation of an interconnect structure connecting bumps 164 and contact pads 176, backgrinding of the encapsulant can also occur during or after the formation of the interconnect structure, e.g., at FIGS. 5o-5q. Backgrinding of encapsulant 210 facilitates adjustment of an overall package height in accordance with a design of the final package.

After removal of carrier 200, carrier tape 202, and thermally releasable layer 204, shallow laser drilling or cleaning is applied on bumps 164 to clean a surface of bumps 164 and to improve contact resistance of the bumps. Bumps 164 are also cleaned, and oxide buildup is removed, using LDA with laser 229, RF etching, plasma clean, or wet clean. In one embodiment, bumps 164 are Cu and naturally occurring oxide formed on copper bumps 164 is removed by RF etching.

FIG. 5n shows an optional warpage balance layer 234 is formed over and contacts surface 224 or 228 of encapsulant 210. Warpage balance layer 234 is formed using printing, spin coating, spray coating, screen printing, lamination, paste printing, compressive molding, transfer molding, liquid encapsulant molding, vacuum lamination, or other suitable applicator. Warpage balance layer 234 can be one or more layers of photosensitive polymer dielectric film with or without fillers, non-photosensitive polymer dielectric film, epoxy, epoxy resin, polymeric materials, polymer composite material such as epoxy resin with filler, epoxy acrylate with filler, or polymer with proper filler, thermoset plastic laminate, or other material having similar insulating and structural properties. Warpage balance layer 234 is formed and cured after final removal or backgrinding of encapsulant 210. Warpage balance layer 234 provides structural support for SoP packages 196, balances stress on the package, and reduces warping or cracking of the package during subsequent handling and processing. Warpage characteristics of warpage balance layer 234, including thickness of the warpage balance layer and material properties, are adjusted according to overall package configuration and design. In one embodiment, warpage balance layer 234 has a thickness in a range of 10 to 60 µm and a CTE in a range of 10 to 150 ppm/degree C.

FIG. 5o shows a first portion of a fan-out multi interconnection RDL is formed over reconstituted wafer 214 by the deposition and patterning of insulating or passivation layer 230 and the deposition and patterning of conductive layer 232 after the removal of carrier 200, carrier tape 202, and thermally releasable layer 204. Insulating layer 230 is conformally applied to, and has a first surface that follows the contours of, encapsulant 210, insulating layer 180, openings 182, contact pads 176, and bumps 164. Insulating layer 230 has a second planar surface opposite the first surface. Insulating layer 230 contains one or more layers of photosensitive low curing temperature dielectric resist, photosensitive composite resist, liquid crystal polymer (LCP), laminate compound film, insulating paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 230 is deposited using printing, spin coating, spray coating, lamination, or other suitable process. Insulating layer 230 is subsequently patterned and cured using UV exposure followed by developing, or other suitable process. A portion of insulating layer 230 is removed by LDA, etching, or other suitable process to form openings that expose contact pads 176 of semiconductor die 170 and bumps 164. Bumps 164 and contact pads 176 can also be cleaned during or after the removal of portion of insulating layer 230 as described previously with respect to bumps 164 in FIG. 5m.

An electrically conductive layer 232 is patterned and deposited over encapsulant 210, semiconductor die 170, and insulating layer 230. Conductive layer 232 can be one or more layers of Al, Cu, Sn, Ni, Au, Ag, or other suitable electrically conductive material or alloy that does not cause delamination between bumps 164 and conductive layer 232. In one embodiment, e.g., when bumps 164 are solder, conductive layer 232 includes an adhesive layer and barrier layer that is a solder wettable material, e.g., chromium copper (CrCu), Au, titanium copper (TiCu) alloy, Ni, or nickel vanadium (NiV) alloy. The deposition of conductive layer 232 uses PVD, CVD, electrolytic plating, electroless plating, or other suitable process. Conductive layer 232 is deposited within the openings in insulating layer 230 and extends completely through the insulating layer to contact bumps 164 and contact pads 176. Accordingly, conductive layer 232 is bonded to bumps 164 for subsequent electrical interconnection without reflowing the bumps. Conductive layer 232 can also be patterned using LDA or other suitable process and operates as an RDL to extend electrical connection from semiconductor die 124 and 170 to points external to semiconductor die 124 and 170.

FIG. 5p shows insulating or passivation layer 236 is conformally applied to, and follows the contours of, insulating layer 230 and conductive layer 232. Insulating layer 236 contains one or more layers of photosensitive low curing temperature dielectric resist, photosensitive composite resist, LCP, laminate compound film, insulating paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 236 is deposited using printing, spin coating, spray coating, lamination, or other suitable process. Insulating layer 236 is subsequently patterned and cured using UV exposure followed by developing, or other suitable process. A portion of insulating layer 236 is removed by LDA, etching, or other suitable process to expose portions of conductive layer 232. In one embodiment, warpage balance layer 234 is formed as described in FIG. 5n after the formation of insulating layer 236.

An electrically conductive layer 238 is patterned and deposited over conductive layer 232, insulating layer 236, SoP packages 196, and encapsulant 210. Conductive layer 238 can be one or more layers of Al, Cu, Sn, Ni, Au, Ag, or other suitable electrically conductive material. The deposition of conductive layer 238 uses PVD, CVD, electrolytic plating, electroless plating, or other suitable process. Conductive layer 238 is disposed in openings in insulating layer 236 and extends completely through the insulating layer to contact conductive layer 232. Conductive layer can also be patterned using LDA or other suitable process and 238 operates as an RDL to extend electrical connection from semiconductor die 124 and 170, through conductive layer 232, to points external to semiconductor die 124 and 170. Additional conductive or RDL layers are added to conductive layers 232 and 238 depending on electrical signal integrity requirements and the general configuration and design of semiconductor die 124 and 176.

FIG. 5q shows insulating or passivation layer 242 is conformally applied to, and follows the contours of, insulating layer 236 and conductive layer 238. Insulating layer 242 contains one or more layers of photosensitive low temperature curing dielectric resist, photosensitive composite resist, LCP, laminate compound film, insulating paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 242 is deposited using printing, spin coating, spray coating, lamination, or other suitable process. Insulating layer 242 is subsequently patterned and cured with UV exposure followed by developing or other suitable process. A portion of insulating layer 242 is removed by LDA, etching, or other suitable process to expose portions of conductive layer 238.

An electrically conductive bump material is deposited over conductive layer 238 and insulating layer 242 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 238 using a suitable attachment or bonding process. In one embodiment, the bump material is reflowed by heating the material above its melting point to form spherical balls or bumps 244. In some applications, bumps 244 are reflowed a second time to improve electrical contact to conductive layer 238. In one embodiment, bumps 244 are formed over a UBM having a wetting layer, barrier layer, and adhesive layer. The bumps can also be compression bonded or thermocompression bonded to conductive layer 238. Bumps 244 represent one type of interconnect structure that can be formed over conductive layer 238. The interconnect structure can also use conductive paste, stud bump, micro bump, conductive columns, composite interconnects, or other electrical interconnect. Together, insulating layers 230, 236, and 242 as well as conductive layers 232, 238, and bumps 244 form interconnect structure or fan-out multi interconnection RDL 246.

Taken together, reconstituted wafer 214, warpage balance layer 234, and interconnect structure 246 form reconstituted wafer 248. Reconstituted wafer 248 is singulated between bumps 244, between SoP packages 196, and through encapsulant 210 and interconnect structure 246 using saw blade or laser cutting tool 250. After completion of interconnect structure 246, SoP packages 196 do not require any additional laser drilling or other processing for the formation of 3-D vertical interconnect.

Figure 1B:
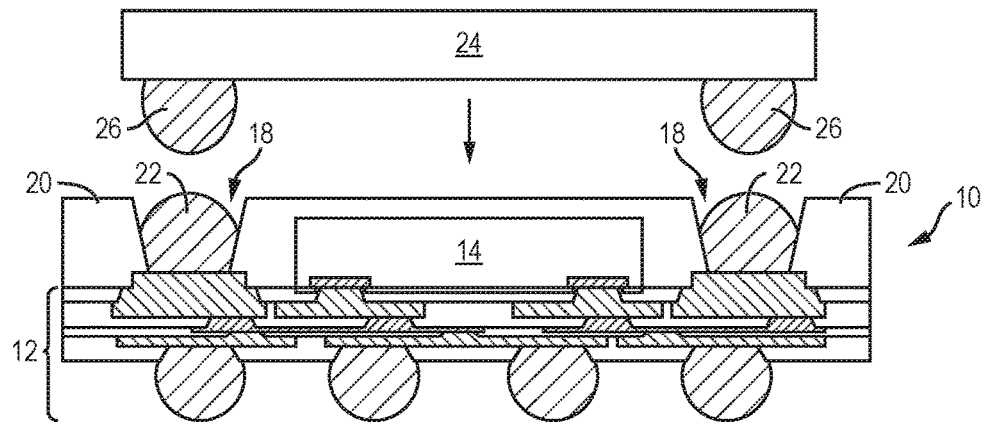
Figure 6A:
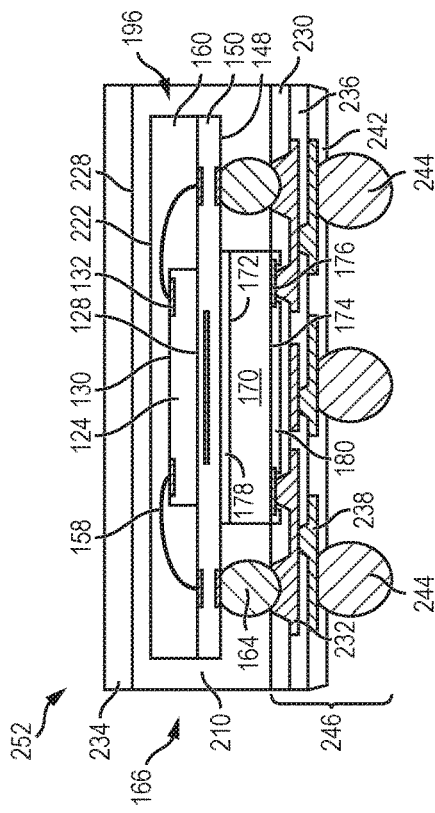
FIGS. 6*a*-6*b* illustrate an embedded SOP fan-out package with a warpage balance layer.

FIG. 6a shows an individual embedded SoP fan-out package 252 resulting from the singulation of reconstituted wafer 248 shown in FIG. 5q. Embedded SoP fan-out package 252 provides horizontal and vertical electrical interconnection for semiconductor die 170 and BGA package 166, which includes semiconductor die 124, and offers a number of advantages over packages known in the prior art, such as 3-D eWLB-MLP package 28 shown in FIG. 1c. For example, embedded SoP fan-out package 252 does not require the formation of openings through encapsulant 210 in a peripheral region outside a footprint of semiconductor die 170 using, e.g., a laser as described in relation to FIG. 1a for eWLB-MLP package 10. By forming bumps 164 as part of BGA package 166, and subsequently forming encapsulant 210 around the bumps rather than forming openings such as laser formed openings 18 through the encapsulant, a cost of producing embedded SoP fan-out package 252 is reduced. Furthermore, by providing vertical interconnection between BGA package 166 and semiconductor die 170 by using a single bumping process to form bumps 164 rather than using a first and second bumping process as described in relation to FIGS. 1b and 1c, processing time and cost are reduced. Processing time and cost are additionally reduced because reconstituted wafer 248 is singulated after completion of interconnect structure 246 such that embedded SoP fan-out package 252 does not require any additional laser drilling or other processing for the formation of 3-D vertical interconnect structures. By mounting semiconductor die 170 over BGA package 166 before depositing encapsulant 210 and before forming interconnect structure 246, a risk of damaging a wafer is reduced during handling and while mounting semiconductor die 170 to BGA package 166 using, e.g., SMT as discussed in relation to FIG. 1c.

Figure 1C:
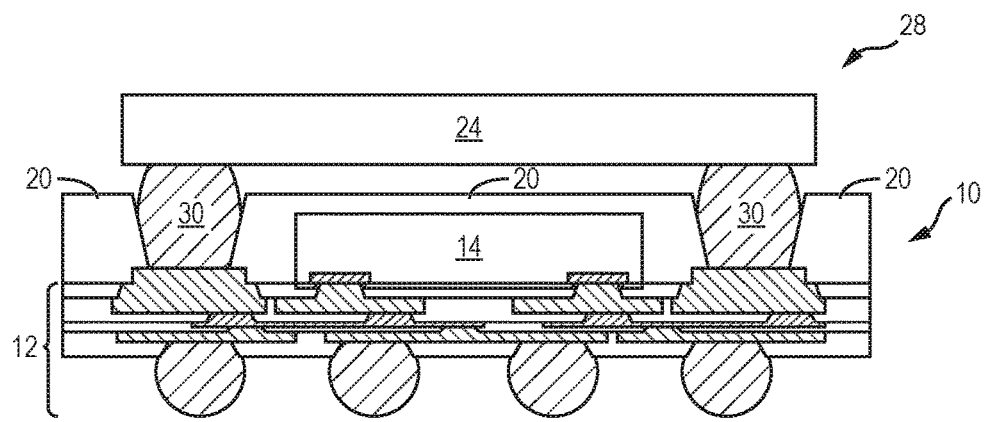

In contrast to the limited flexibility of controlling an overall height of 3-D eWLB-MLP package 28, as discussed in relation to FIG. 1c, a total height of embedded SoP fan-out package 252 can be easily controlled. The total height of embedded SoP fan-out package 252 is controlled by adjusting a height or thickness of BGA package 166, semiconductor die 170, encapsulant 210, and interconnect structure 246. In one embodiment, a total thickness or height of embedded SoP fan-out package 252 is less than or equal to about 1 millimeter (mm), or less than or equal to about 800 µm, or less than about 600 µm.

Figure 6B:
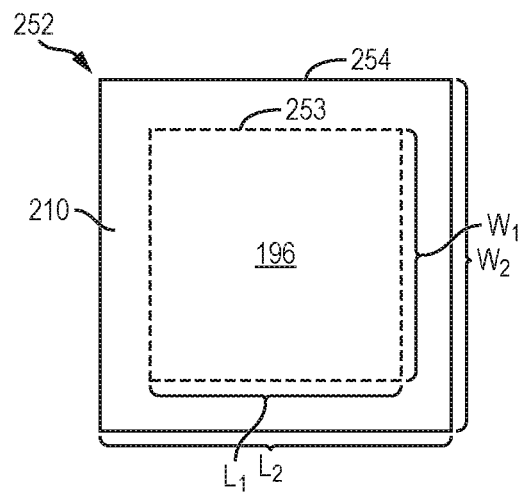

FIG. 6b shows a top or plan view of embedded SoP fan-out package 252 including SoP package 196 embedded within fan-out package 252 as previously shown in cross-sectional view in FIG. 6a. An overall width W1 of SoP package 196 is less than an overall width W2 of embedded SoP fan-out package 252. Similarly, an overall length L1 of SoP package 196 is less than an overall length L2 of embedded SoP fan-out package 252. Accordingly, edges 253 of SoP package 196 are offset with respect to edges 254 of embedded SoP fan-out package 252, and are recessed within the package and are covered by encapsulant 210. In one embodiment, both the width W1 and length L1 of SoP package 196 are at least 50 µm less than the width W2 and length L2 of embedded SoP fan-out package 252, respectively.

Figure 7:
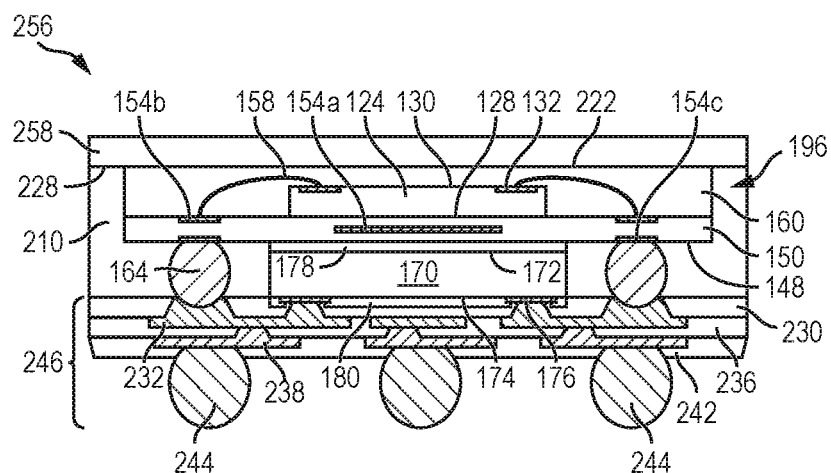
FIG. 7 illustrates another embodiment of an embedded SOP fan-out package with a warpage balance layer.

FIG. 7 shows an individual embedded SoP fan-out package 256 similar to embedded SoP fan-out package 252 from FIG. 6a. FIG. 7 includes warpage balance layer 258 that is similar to warpage balance layer 234 from FIG. 6a. Embedded SoP fan-out package 256 differs from embedded SoP fan-out package 252 by mounting warpage balance layer 258 to back surface 222 of SoP package 196 rather than mounting the warpage balance layer to a portion of encapsulant 210 disposed between the warpage balance layer and the SoP package. Warpage balance layer 258 is formed over and contacts surface 224 or 228 of encapsulant 210 and back surface 222 of SoP package 196. Warpage balance layer 258 provides structural support for embedded SoP fan-out package 252, balances stress on the package, and reduces warping or cracking of the package during subsequent handling and processing. Warpage characteristics of warpage balance layer 258, including thickness of the warpage balance layer and material properties, are adjusted according to overall package configuration and design. In one embodiment, warpage balance layer 258 has a thickness in a range of 10 to 60 µm and a CTE in a range of 10 to 150 ppm/degree C. Warpage balance layer 258 is formed after final backgrinding of encapsulant 210 and encapsulant 160 in which encapsulant 160 is exposed. Warpage balance layer 258 is formed before, during, or after the formation of interconnect structure 246.

Accordingly, embedded SoP fan-out package 256 efficiently provides horizontal and vertical electrical interconnection for a plurality of semiconductor die embedded within a 3-D fan-out semiconductor package. Embedded SoP fan-out package 256 also provides flexibility in controlling overall package height. Because embedded SoP fan-out package 256 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

Figure 8:
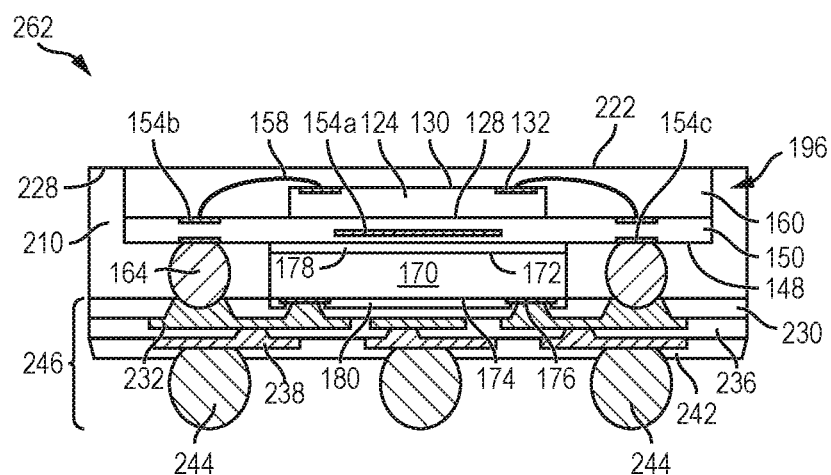
FIG. 8 illustrates another embodiment of an embedded SOP fan-out package.

FIG. 8 shows an individual embedded SoP fan-out package 262 similar to embedded SoP fan-out package 256 from FIG. 7. Embedded SoP fan-out package 262 differs from embedded SoP fan-out package 256 by including an exposed back surface 222 of encapsulant 160 as part of the final embedded SoP fan-out package 262. Back surface 222 of encapsulant 160 is exposed by backgrinding encapsulant 210 and encapsulant 160, which occurs before, during, or after the formation of interconnect structure 246.

Accordingly, embedded SoP fan-out package 262 efficiently provides horizontal and vertical electrical interconnection for a plurality of semiconductor die embedded within a 3-D fan-out semiconductor package. Embedded SoP fan-out package 262 also provides flexibility in controlling overall package height. Because embedded SoP fan-out package 262 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

Figure 9:
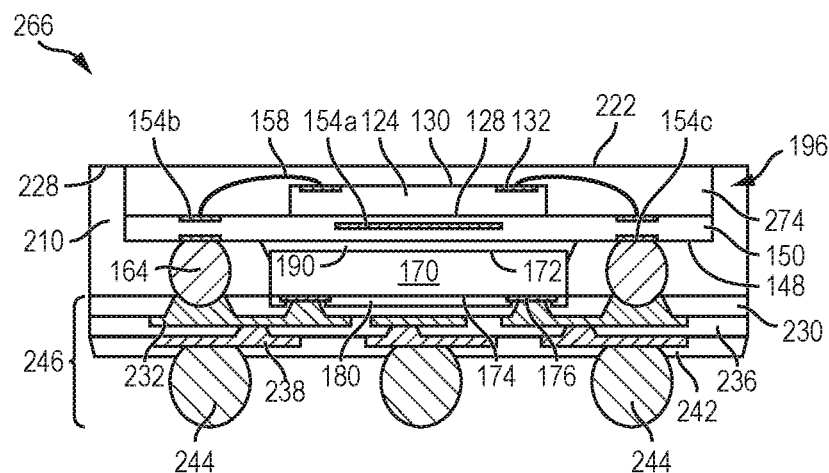
FIG. 9 illustrates an embedded SOP fan-out package with a die attach adhesive.

FIG. 9 shows an individual embedded SoP fan-out package 266 similar to embedded SoP fan-out package 262 from FIG. 8. In embedded SoP fan-out package 266, back surface 222 of encapsulant 160 is exposed as part of the final embedded SoP fan-out package 266. Back surface 222 of encapsulant 160 is exposed by backgrinding encapsulant 210 and encapsulant 160 before, during, or after the formation of interconnect structure 246.

Embedded SoP fan-out package 266 differs from embedded SoP fan-out package 262 by the inclusion of die attach adhesive 190. Die attach adhesive 190 is initially disposed over and contacts substrate 144 while being separate from semiconductor die 170. Die attach adhesive 190 is not initially disposed over back surface 172 of semiconductor die 170 like die attach tape or adhesive 178 shown in FIG. 5e and included in FIG. 8. As semiconductor die 170 is mounted to substrate 144, adhesive 190 comes in contact with back surface 172 of the semiconductor die as well as side surfaces of the semiconductor die to contact the semiconductor die between back surface 172 and active surface 174.

Accordingly, embedded SoP fan-out package 266 efficiently provides horizontal and vertical electrical interconnection for a plurality of semiconductor die embedded within a 3-D fan-out semiconductor package. Embedded SoP fan-out package 266 also provides flexibility in controlling overall package height. Because embedded SoP fan-out package 266 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

Figure 10:
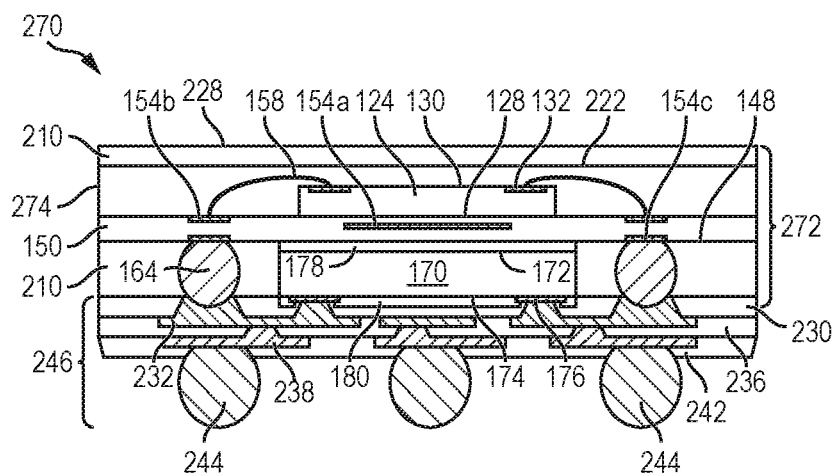
FIG. 10 illustrates an embodiment of an embedded SOP fan-out package including a BGA package.

FIG. 10 shows an individual embedded SoP fan-out package 270 similar to embedded SoP fan-out package 252 from FIG. 6*a*. In embedded SoP fan-out package 270, back surface 222 of encapsulant 160 is covered by encapsulant 210 as part of the final embedded SoP fan-out package 270. Alternatively, back surface 222 can be exposed with respect to encapsulant 210. Embedded SoP fan-out package 270 includes a BGA package 272 similar to BGA package 166 shown in FIG. 5*d*. BGA package 272 differs from BGA package 166 or SoP package 196 by having a width substantially equal to an overall width of embedded SoP fan-out package 270. As such, side surfaces 274 of BGA package 272 are coextensive and coterminous with a portion of a surface of embedded SoP fan-out package 270. Side surfaces 274 are not covered with encapsulant 210 and are exposed with respect to embedded SoP fan-out package 270 because BGA package 272 has an area or footprint that is substantially equal to an area or footprint of embedded SoP fan-out package 270.

Accordingly, embedded SoP fan-out package 270 efficiently provides horizontal and vertical electrical interconnection for a plurality of semiconductor die embedded within a 3-D fan-out semiconductor package. Embedded SoP fan-out package 270 also provides flexibility in controlling overall package height. Because embedded SoP fan-out package 270 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

FIG. 11*a*, continuing from FIG. 5*e* or 5*f*, shows BGA packages 280 similar to BGA packages 166 with semiconductor die 170 mounted to substrate 144 with back surface 172 oriented toward second surface 148 of substrate 144. An encapsulant molding compound or underfill 278 is deposited around semiconductor die 170, over substrate 144, and around bumps 164 using a paste printing, compressive molding, transfer molding, liquid encapsulant molding, vacuum lamination, or other suitable applicator. Encapsulant 278 can be polymer composite material, such as epoxy resin with filler, epoxy acrylate with filler, or polymer with proper filler. In one embodiment, the filler included within encapsulant 278 includes particles with a size less than or equal to about 100 µm at either a liquid, powder, or granular phase. Encapsulant 278 is non-conductive, provides physical support, and environmentally protects the semiconductor device from external elements and contaminants. In one embodiment, encapsulant 278 is deposited using film-assisted molding process. Encapsulant 278 is deposited after semiconductor die 170 is mounted to BGA package 280, and does not cover active surface 174, contact pads 176, or a top surface of insulating layer 180. After reflow or curing of encapsulant 278, singulation occurs through substrate 144, encapsulant 160, and encapsulant 278, and also occurs between bumps 164, semiconductor die 124, and semiconductor die 170 using a saw blade or laser cutting tool 282 into individual BGA packages 280.

FIG. 11*b* shows a BGA package 280 from FIG. 11*a* included as part of embedded SoP fan-out package 286. After the singulation of BGA package 280 as shown in FIG. 11*a*, the BGA packages are formed into embedded SoP fan-out package 286 according to the processes outlined for SoP packages 252 as described in FIGS. 5*i*-5*q*. Embedded SoP fan-out package 286 can be made with or without a warpage balance layer similar to warpage balance layer 234 shown in FIG. 6*a*. Accordingly, embedded SoP fan-out package 280 efficiently provides horizontal and vertical electrical interconnection for a plurality of semiconductor die embedded within a 3-D fan-out semiconductor package. Embedded SoP fan-out package 280 also provides flexibility in controlling overall package height. Because embedded SoP fan-out package 280 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

FIG. 12*a*, similar to FIG. 5*g*, shows SoP packages 308 similar to SoP packages 196 with semiconductor die 290 mounted to substrate 144 with a back surface 292 of the semiconductor die oriented toward second surface 148 of substrate 144. Semiconductor die 290 are similar to semiconductor die 170 from FIG. 5*e*, and include an active surface 294 opposite back surface 292. Active surface 294 includes contact pads 296 and an insulating or passivation layer 298 conformally applied over the active surface. A portion of insulating layer 298 is removed by LDA, etching, or other process to form openings 300 in insulating layer 298 to expose contact pads 296.

An electrically conductive layer 304 is patterned and deposited over active semiconductor die 290, insulating layer 298, and contact pads 296. Conductive layer 304 can be one or more layers of Al, Cu, Sn, Ni, Au, Ag, or other suitable electrically conductive material. The deposition of conductive layer 304 uses PVD, CVD, electrolytic plating, electroless plating, or other suitable process. Conductive layer 304 is deposited over insulating layer 298 and within openings 300 in insulating layer 298 and connects to contact pads 296 to operate as an RDL and extend electrical connection from semiconductor die 290 to points external to semiconductor die 290. Unlike contact pads 296, conductive layer 304 is not covered by insulating layer 298, and is therefore exposed with respect to the insulating layer when semiconductor die 290 is mounted to substrate 144.

After semiconductor die 290 are mounted to substrate 144 in a process similar to the process described in FIGS. 5*e* and 5*f*, substrate 144 and encapsulant 160 are singulated between bumps 164, semiconductor die 124, and semiconductor die 290 using a saw blade or laser cutting tool 306 to form individual SoP packages 308.

In FIG. 12b, SoP packages 308 are shown undergoing additional packaging similar to the steps undergone by SoP packages 196 in FIGS. 5i-5l. FIG. 12b shows SoP packages 308 are mounted to carrier 312, carrier tape 314, and thermally releasable layer 316, similar to carrier 200, carrier tape 202, and thermally releasable layer 204, respectively, shown in FIG. 5i. SoP packages 308 are mounted over carrier 312 using a pick and place operation such that a portion of bumps 164 is deposited within a thickness of, and surrounded by, a portion of thermally releasable layer 316. Similarly, a portion of semiconductor die 290 including insulating layer 298 and conductive layer 304 are also deposited within, and surrounded by, a thickness of thermally releasable layer 316 or a single layer of carrier tape or adhesive.

FIG. 12b further shows an encapsulant or molding compound 320, similar to encapsulant or molding compound 210, is formed over carrier 312 and over and around SoP packages 308 similar to the process shown in FIGS. 5k and 5l. In one embodiment, encapsulant 320 is pre-dispensed or laminated over carrier 312 and then cured using compression molding as described in a process similar to FIGS. 5k and 5l. After encapsulation of SoP packages 308, a bottom surface 322 of encapsulant 320 is formed and extends along an interface between the encapsulant and thermally releasable layer 316. Bottom surface 322 of encapsulant 320 is recessed or vertically offset with respect to a bottom surface 324 of conductive layer 304 to create a stand-off distance between bottom surface 322 and bottom surface 324. Carrier 312, carrier tape 314, and thermally releasable layer 316 are removed in a manner similar to the removal of carrier 200, carrier tape 202, and thermally releasable layer 204 as described in relation to FIG. 5m, such that conductive layer 304 including bottom surface 324 is exposed for subsequent interconnection with a later formed interconnect structure.

Figure 12C:
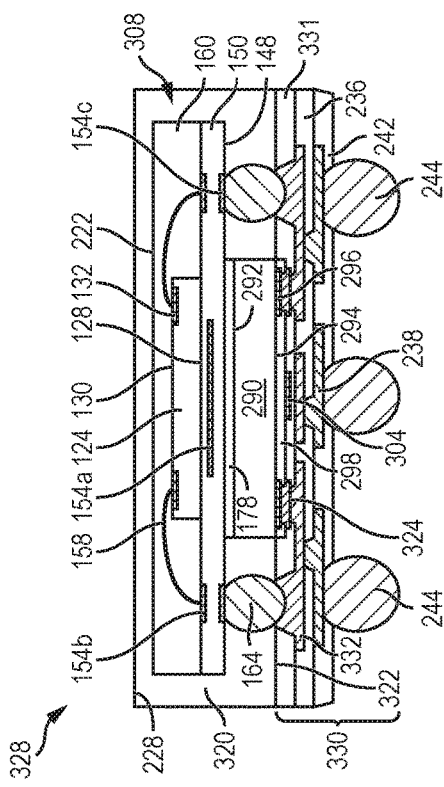

FIG. 12c shows an encapsulated SoP package 308 from FIG. 12b embedded as part of embedded SoP fan-out package 328. After the formation of encapsulant 320 and removal of carrier 312, carrier tape 314, and thermally releasable layer 316 as described above, embedded SoP fan-out package 328 is formed according to the processes outlined for SoP packages 252 as described in FIGS. 5m-5q. In embedded SoP fan-out package 328, interconnect structure 330 is formed in a process similar to the formation of interconnect structure 246. As shown in FIG. 12c, interconnect structure 330 includes insulating layer 331 similar to insulating layer 230 from FIG. 5o that is conformally applied to, and has a first surface that follows the contours of, encapsulant 320, insulating layer 298, conductive layer 304, and bumps 164. Insulating layer 331 has a second planar surface opposite the first surface. Interconnect structure 330 also includes conductive layer 332 similar to conductive layer 232 from FIG. 5o that electrically connects to contact pads 296 of semiconductor die 290 through conductive layer 304. Interconnect structure 330 operates to extend electrical connection from semiconductor die 124 and 290 to points external to embedded SoP fan-out package 328. Furthermore, embedded SoP fan-out package 328 can be made with or without a warpage balance layer similar to layer 234 shown in FIG. 6a.

Accordingly, embedded SoP fan-out package 328 efficiently provides horizontal and vertical electrical interconnection for a plurality of semiconductor die embedded within a 3-D fan-out semiconductor package. Embedded SoP fan-out package 328 also provides flexibility in controlling overall package height. Because embedded SoP fan-out package 328 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

Figure 13A:
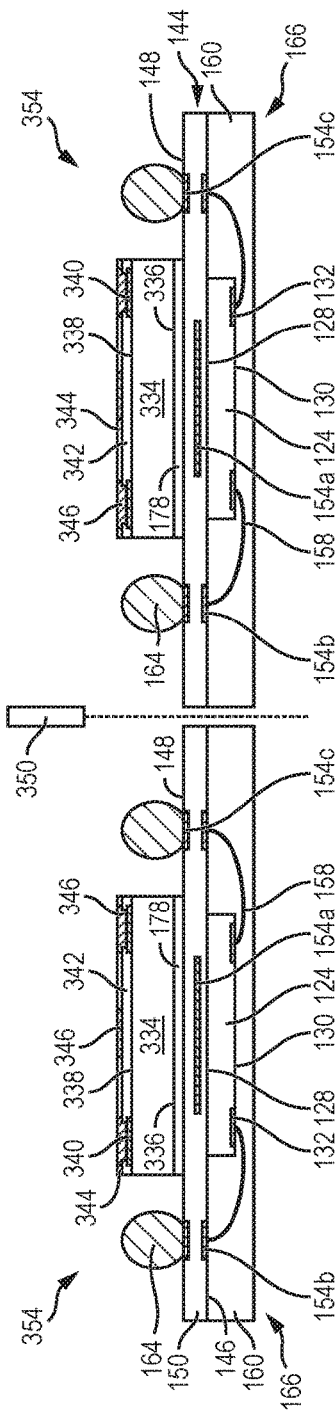
FIGS. 13*a*-13*d* illustrate another embodiment of an embedded SOP fan-out package including a conductive layer disposed over a BGA package.

FIG. 13a, similar to FIGS. 5g and 12a, shows BGA array packages 166 with semiconductor die 334 mounted to substrate 144 with a back surface 336 of the semiconductor die oriented toward second surface 148 of substrate 144. Semiconductor die 334 are similar to semiconductor die 170 from FIG. 5e and semiconductor die 290 from FIG. 12a, and include an active surface 338 opposite back surface 336. Active surface 338 includes contact pads 340 and an insulating or passivation layer 342 conformally applied over the active surface. A portion of insulating layer 342 is removed by LDA, etching, or other process to form openings in insulating layer 342 to expose contact pads 340.

An insulating or passivation layer 344 is formed over active surface 338 of semiconductor die 334 and has a first surface that is conformally applied to, and follows the contours of, insulating layer 342 and contact pads 340. Insulating layer 344 has a second planar surface opposite the first surface. Insulating layer 344 contains one or more layers of photosensitive low curing temperature dielectric resist, photosensitive composite resist, solder mask resist film, liquid molding compound, SiO2, Si3N4, SiON, Ta2O5, Al2O3, or other material having similar insulating and structural properties. Insulating layer 344 is deposited using printing, spin coating, spray coating, lamination, or other suitable process. Insulating layer 344 is subsequently patterned and cured using UV exposure followed by developing, or other suitable process. A portion of insulating layer 344 is removed by LDA, etching, or other suitable process to form openings that expose contact pads 340 of semiconductor die 334 and portions of insulating layer 342 to contain a subsequently deposited conductive material.

An electrically conductive layer 346 is patterned and deposited within the openings in insulating layer 344 and over insulating layer 342 and contact pads 340. Conductive layer 346 can be one or more layers of Al, Cu, Sn, Ni, Au, Ag, or other suitable electrically conductive material. The deposition of conductive layer 346 uses PVD, CVD, electrolytic plating, electroless plating, or other suitable process. In one embodiment, conductive layer 346 is formed by Cu plating and includes a plating seed layer. Conductive layer 346 operates as an RDL and to extend electrical connection from semiconductor die 334 to points external to semiconductor die 334. Unlike contact pads 340, a top surface of conductive layer 346 is not covered by insulating layer 342 or insulating layer 344, and is therefore exposed with respect to insulating layers 342 and 344 when semiconductor die 334 is mounted to BGA package 166.

After semiconductor die 334 are mounted to substrate 144 in a process similar to the process described in FIGS. 5e and 5f, substrate 144 and encapsulant 160 are singulated between bumps 164, semiconductor die 124, and semiconductor die 334 using a saw blade or laser cutting tool 350 to separate semiconductor die 334 mounted to BGA packages 166 to form individual SoP packages 354.

Figure 13B:
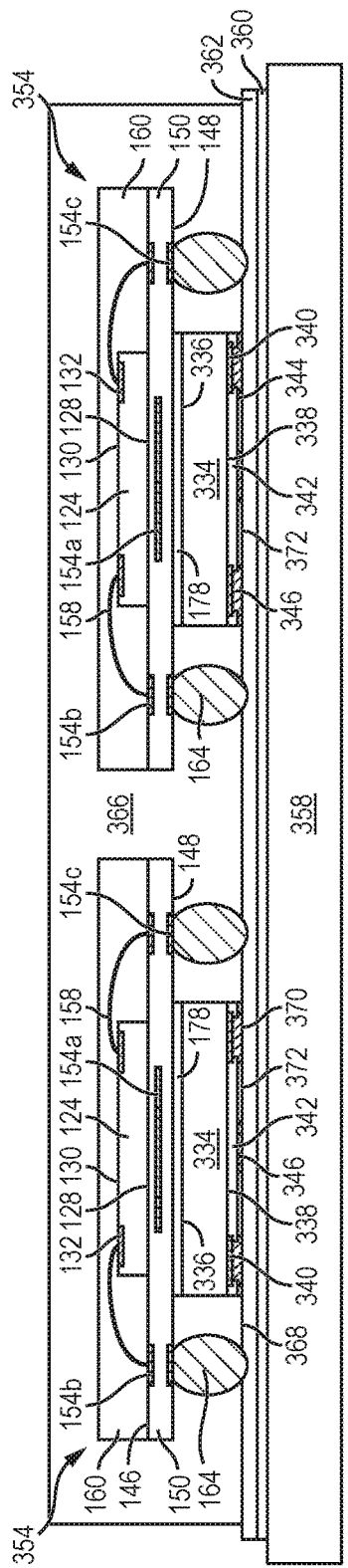

In FIG. 13b, SoP packages 354 are shown undergoing additional packaging similar to the steps undergone by SoP packages 196 in FIGS. 5i-5l. FIG. 13b shows SoP packages 354 are mounted to carrier 358, carrier tape 360, and thermally releasable layer 362, similar to carrier 200, carrier tape 202, and thermally releasable layer 204, respectively, shown in FIG. 5i. SoP packages 354 are mounted over carrier 358 using a pick and place operation such that a portion of bumps 164 is deposited within a thickness of, and surrounded by, a portion of thermally releasable layer 362. Insulating layer 344 and conductive layer 346 are mounted level with a surface of thermally releasable layer 362 and in one embodiment do not extend within a thickness of, and are not surrounded by, a portion of thermally releasable layer 362 or a single layer of carrier tape or adhesive. Alternatively, a portion of insulating layer 344 and conductive layer 346 do extend within a thickness of, and are surrounded by, thermally releasable layer 362 or a single layer of carrier tape or adhesive.

FIG. 13b further shows an encapsulant or molding compound 366 similar to encapsulant or molding compound 210 from FIG. 5k is formed over carrier 358 and over and around SoP packages 354 similar to the process shown in FIGS. 5k and 5l. In one embodiment, encapsulant 366 is pre-dispensed or laminated over carrier 358 and then cured using compression molding in a process similar to the process described in relation to FIGS. 5k and 5l. After encapsulation of SoP packages 354, a bottom surface 368 of encapsulant 366 is formed and extends along an interface between the encapsulant and thermally releasable layer 362. Bottom surface 368 of encapsulant 366 is coplanar with respect to a bottom surface 370 of conductive layer 346 and bottom surface 372 of insulating layer 344. In one embodiment, bottom surface 372 of insulating layer 344 and bottom surface 370 of conductive layer 346 are vertically offset with respect to bottom surface 368 of encapsulant 366.

Figure 13C:
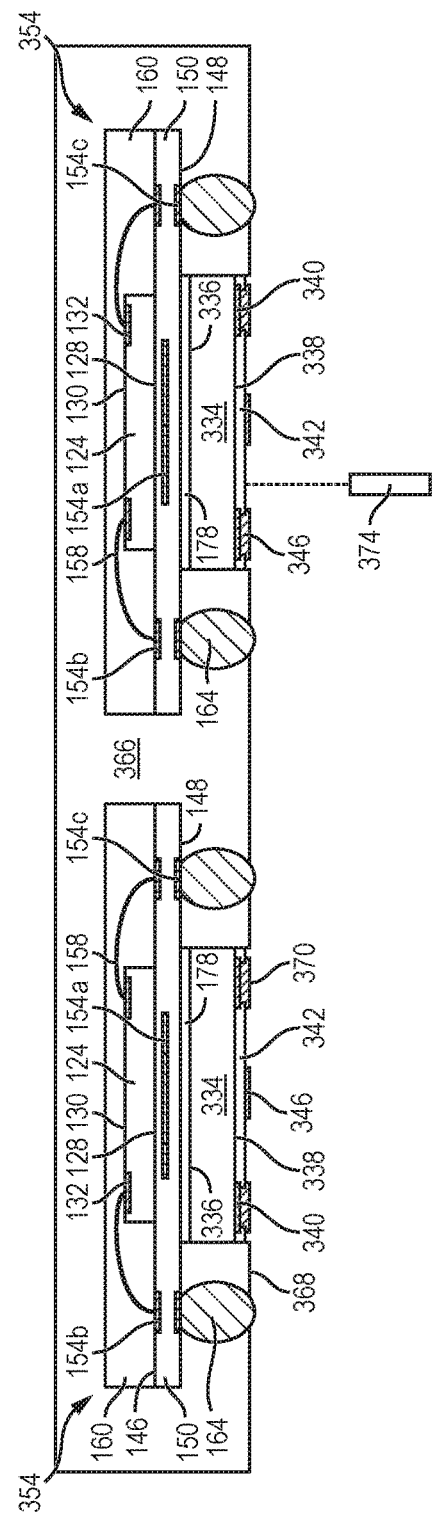

In FIG. 13c, carrier 358, carrier tape 360, and thermally releasable layer 362 are removed, similar to the removal of carrier 200, carrier tape 202, and thermally releasable layer 204 described in relation to FIG. 5m. Conductive layer 346 including bottom surface 370, and insulating layer 344 including bottom surface 372, are exposed with the removal of carrier 358, carrier tape 360, and thermally releasable layer 362. After the removal of carrier 358, carrier tape 360, and thermally releasable layer 362, insulating layer 344 is removed by stripping with a solvent and plasma or other suitable process and the seed layer of conductive layer 346 is removed by etching or other suitable process. In one embodiment, insulating layer 344 and the seed layer of conductive layer 346 are removed by LDA with laser 374. With the removal of insulating layer 344 and removal of the seed layer of conductive layer 346, a shallow cavity or recess may be formed with respect to bottom surface 368 of encapsulant 366. The cavity is made before the subsequent formation of an interconnect structure over SoP packages 354.

Figure 13D:
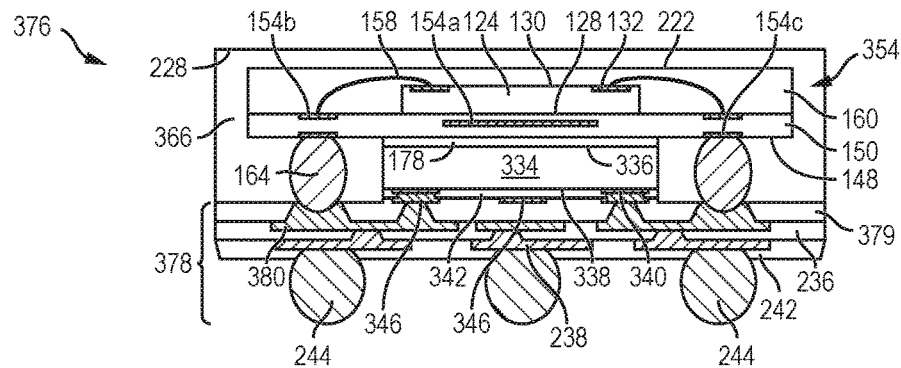

FIG. 13d shows an encapsulated SoP package 354 from FIG. 13c included as part of embedded SoP fan-out package 376. After the formation of encapsulant 366 and removal of carrier 358, carrier tape 360, thermally releasable layer 362, and insulating layer 344 as described above, embedded SoP fan-out package 376 is formed according to the processes outlined for embedded SoP packages 252 as described in FIGS. 5m-5q. In embedded SoP fan-out package 376, interconnect structure 378 is formed in a process similar to the formation of interconnect structure 246. As shown in FIG. 13d, interconnect structure 378 includes insulating layer 379 similar to insulating layer 230 from FIG. 5o that is conformally applied to, and has a first surface that follows the contours of, encapsulant 366, insulating layer 342, conductive layer 346, and bumps 164. Insulating layer 379 has a second planar surface opposite the first surface. Interconnect structure 378 also includes conductive layer 380 similar to conductive layer 232 from FIG. 5o that electrically connects to contact pads 340 of semiconductor die 334 through conductive layer 346. Interconnect structure 378 operates to extend electrical connection from semiconductor die 124 and 334 to points external to embedded SoP fan-out package 376. Furthermore, embedded SoP fan-out package 376 can be made with or without a warpage balance layer similar to layer 234 shown in FIG. 6a.

Accordingly, embedded SoP fan-out package 376 efficiently provides horizontal and vertical electrical interconnection for a plurality of semiconductor die embedded within a 3-D fan-out semiconductor package. Embedded SoP fan-out package 376 also provides flexibility in controlling overall package height. Because embedded SoP fan-out package 376 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

Figure 14:
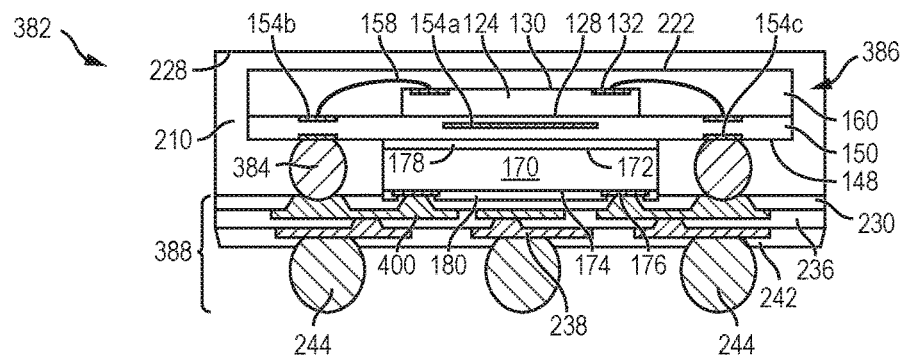
FIG. 14 illustrates an embodiment of an embedded SOP fan-out package including copper bumps.

FIG. 14 shows, an individual embedded SoP fan-out package 382 similar to embedded SoP fan-out package 252 from FIG. 6a. Embedded SoP fan-out package 382 differs from SoP fan-out package 252 by the inclusion of copper bumps 384 that are part of SoP package 386 and are similar to bumps 164 from SoP package 196 as described with reference to FIG. 6a. Copper bumps 384 are bonded to interconnect structure 388, which is similar to interconnect structure 246 in FIG. 6a. Interconnect structure 388 is formed over semiconductor die 170, over encapsulant 210, and over copper bumps 384 after removal of carrier 200, carrier tape 202, and thermally releasable layer 204. After removal of carrier 200, carrier tape 202, and thermally releasable layer 204 but before formation of interconnect structure 388, shallow laser drilling or cleaning is applied on bumps 384 to clean the surface of bumps 384 and to improve contact resistance of the bumps. Bumps 384 are cleaned by removing naturally occurring oxide from copper bumps 384 using RF etching, LDA, plasma clean, wet clean, or other suitable process.

Interconnect structure 388 is formed over semiconductor die 170, over encapsulant 210, and over copper bumps 384. Interconnect structure 388 includes an electrically conductive layer 400 that is similar to conductive layer 232 in interconnect structure 246. Conductive layer 400 is one or more layers of Al, Cu, Sn, Ni, Au, Ag, or other suitable electrically conductive material or alloy that does not cause delamination between bumps 384 and conductive layer 400. In one embodiment, conductive layer 400 includes an adhesive layer and barrier layer that is TiW, Ti, CrCu, Al, or other suitable metal or metal alloy. By forming conductive layer 400 in contact with copper bumps 384, copper bumps 384 can be bonded to conductive layer 400 for subsequent electrical interconnection without reflowing the bumps.

Accordingly, embedded SoP fan-out package 382 efficiently provides horizontal and vertical electrical interconnection for a plurality of semiconductor die embedded within a 3-D fan-out semiconductor package. Embedded SoP fan-out package 382 also provides flexibility in controlling overall package height. Because embedded SoP fan-out package 382 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

Figure 15:
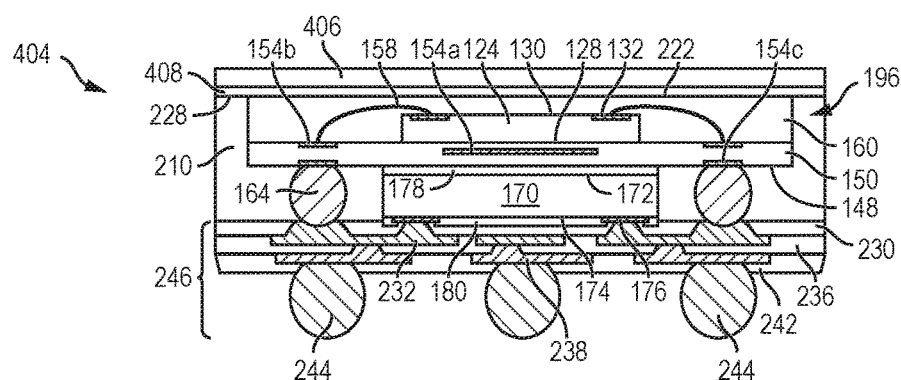
FIG. 15 illustrates an embodiment of an embedded SOP fan-out package including a metal film attached over the package.

FIG. 15 shows an individual embedded SoP fan-out package 404 similar to embedded SoP fan-out package 262 from FIG. 8. In embedded SoP fan-out package 404, back surface 222 of encapsulant 160 is exposed from encapsulant 210. Back surface 222 of encapsulant 160 is exposed by removing encapsulant 210 from over encapsulant 160, e.g., by backgrinding. Backgrinding to expose back surface 222 occurs before, during, or after the formation of interconnect structure 246. Alternatively, back surface 222 of encapsulant 160 is exposed with respect to encapsulant 210 by forming encapsulant 210 around SoP package 196 without encapsulant 210 covering back surface 222 of encapsulant 160.

A metal film 406 is attached to encapsulant 210 and to back surface 222 of encapsulant 160 with an adhesive 408. Metal film 406 is formed by lamination or other suitable process to increase thermal performance or to provide shielding with respect to electromagnetic interference of embedded SoP fan-out package 404.

In one embodiment, adhesive 408 is a thermal interface material (TIM) such as thermal epoxy, thermal epoxy resin, thermal conductive paste, aluminum oxide, zinc oxide, boron nitride, pulverized silver, or thermal grease that is formed on encapsulant 210 and on back surface 222 of encapsulant 160. Metal film 406 serves as a heat spreader that is thermally connected to adhesive or TIM 408 and is mounted over encapsulant 210 and back surface 222 of encapsulant 160. Metal film or heat spreader 406 can be Cu, Al, or other material with high thermal conductivity. Together, metal film or heat spreader 406 and adhesive or TIM 408 form a thermally conductive path that aids with distribution and dissipation of heat generated by semiconductor die 124 and 170 to increase thermal performance of embedded SoP fan-out package 404.

Metal film 406 can also act as a shielding layer and can be Al, ferrite or carbonyl iron, stainless steel, nickel silver, low-carbon steel, silicon-iron steel, foil, conductive resin, and other metals and composites capable of blocking or absorbing electromagnetic interference (EMI), radio frequency interference (RFI), harmonic distortion, and other inter-device interference. Metal film 406 is patterned and conformally deposited using an electrolytic plating, electroless plating, sputtering, PVD, CVD, or other suitable metal deposition process. Metal film 406 can also be a non-metal material such as carbon-black or aluminum flake to reduce the effects of EMI and RFI. For non-metal materials, metal film 406 can be applied by lamination, spraying, or painting.

Accordingly, embedded SoP fan-out package 404 efficiently provides horizontal and vertical electrical interconnection for a plurality of semiconductor die embedded within a 3-D fan-out semiconductor package. Embedded SoP fan-out package 404 also provides flexibility in controlling overall package height. Because embedded SoP fan-out package 404 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

Figure 16:
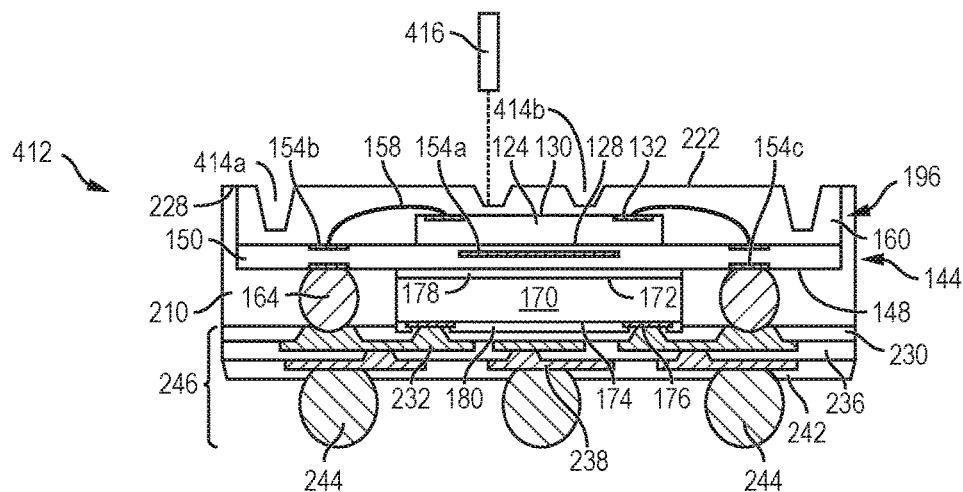
FIG. 16 illustrates an embodiment of an embedded SOP fan-out package including openings formed in the package to provide stress relief.

FIG. 16 shows an individual embedded SoP fan-out package 412 similar to embedded SoP fan-out package 262 from FIG. 8. In embedded SoP fan-out package 412, back surface 222 of encapsulant 160 is exposed from encapsulant 210. Back surface 222 of encapsulant 160 is exposed by removing encapsulant 210 from over encapsulant 160, e.g., by backgrinding. Backgrinding to expose back surface 222 occurs before, during, or after the formation of interconnect structure 246. Alternatively, back surface 222 of encapsulant 160 is exposed with respect to encapsulant 210 by forming encapsulant 210 around SoP package 196 without encapsulant 210 covering back surface 222 of encapsulant 160.

A number of openings 414 are formed in encapsulant 160 or 210 that extend from back surface 222 or an outer surface of embedded SoP fan-out package 412, partially but not completely, through the encapsulant. Alternatively, a number of openings 414 extend completely through encapsulant 160 to expose substrate 144. Openings 414 are formed by LDA or shallow laser drilling with laser 416. Openings 414 include a number of openings 414a formed in a peripheral area around semiconductor die 124 and bond wires 158, and a number of openings 414b formed in a central area of encapsulant 160 over semiconductor die 124 and bond wires 158. Openings 414 include tapered or vertical sidewalls and include cross sectional areas having circular, square, rectangular, or any geometric shape. In one embodiment, openings 414a have a depth greater than a depth of openings 414b, or alternatively openings 414a and 414b have equal depths. In another embodiment, openings 414b have a depth greater than openings 414a. Openings 414 provide stress relief and reduce an effective thickness of embedded SoP fan-out package 412 and provide potential improvements for temperature cycling on board (TCoB) tests.

Accordingly, embedded SoP fan-out package 412 efficiently provides horizontal and vertical electrical interconnection for a plurality of semiconductor die embedded within a 3-D fan-out semiconductor package. Embedded SoP fan-out package 412 also provides flexibility in controlling overall package height. Because embedded SoP fan-out package 412 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

Figure 17:
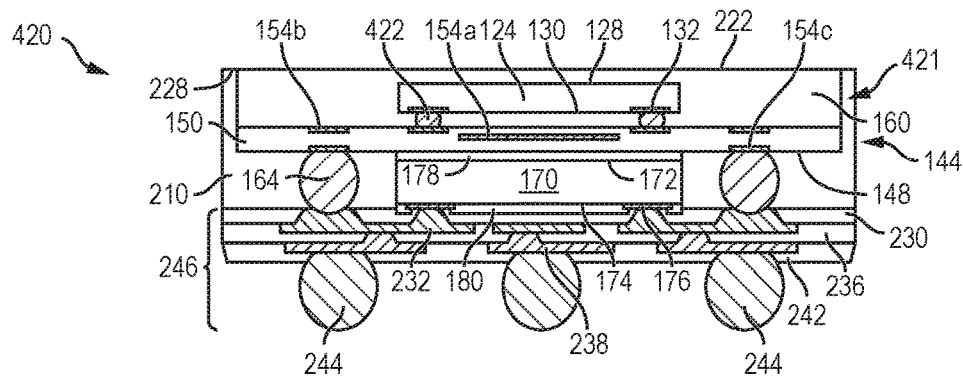
FIG. 17 illustrates another embodiment of an embedded SOP fan-out package including microbumps.

FIG. 17 shows an individual embedded SoP fan-out package 420 similar to embedded SoP fan-out package 262 from FIG. 8. In embedded SoP fan-out package 420, back surface 222 of encapsulant 160 is exposed from encapsulant 210. Back surface 222 of encapsulant 160 is exposed by removing encapsulant 210 from over encapsulant 160, e.g., by backgrinding. Backgrinding to expose back surface 222 occurs before, during, or after the formation of interconnect structure 246. Alternatively, back surface 222 of encapsulant 160 is exposed with respect to encapsulant 210 by forming encapsulant 210 around SoP package 421 without encapsulant 210 covering back surface 222 of encapsulant 160.

Embedded SoP fan-out package 420 of FIG. 17 differs from embedded SoP fan-out package 262 of FIG. 8 by mounting semiconductor die 124 to substrate 144 with bumps 422 rather than bond wires 158. Bumps 422 are formed by depositing an electrically conductive bump material over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 422. In some applications, bumps 422 are reflowed a second time to improve electrical contact to contact pads 132. Bumps 422 can also be compression bonded or thermocompression bonded to contact pads 132. In one embodiment, bumps 422 are copper microbumps. Semiconductor die 124 are mounted to substrate 144 with bumps 422 and with active surface 130 of the semiconductor die oriented toward the substrate.

Accordingly, embedded SoP fan-out package 420 efficiently provides horizontal and vertical electrical interconnection for a plurality of semiconductor die embedded within a 3-D fan-out semiconductor package. Embedded SoP fan-out package 420 also provides flexibility in controlling overall package height. Because embedded SoP fan-out package 420 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

Figure 18:
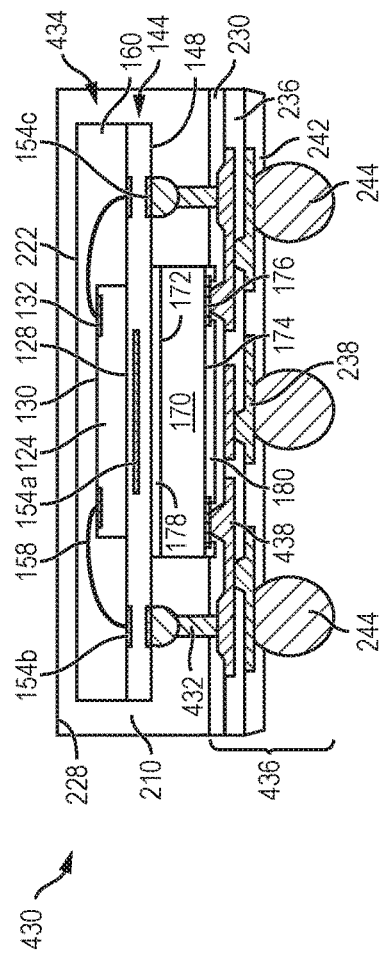
FIG. 18 illustrates another embodiment of an embedded SOP fan-out package including stud bumps.

FIG. 18 shows, an individual embedded SoP fan-out package 430 similar to embedded SoP fan-out package 252 from FIG. 6a. Embedded SoP fan-out package 430 differs from SoP fan-out package 252 by the inclusion of stud wire bump or half-cut wedge wire bond 432 as part of SoP package 434. Stud bumps 432 include Cu or Au stud wire bumps, half-cut wedge Cu wire bonds, or stud bumps or wire bonds of other suitable electrically conductive materials. Stud bumps 432, similar to bumps 164 from SoP package 196 described in FIG. 6a, provide vertical interconnection within embedded SoP fan-out package 430. Stud bumps 432 are bonded to interconnect structure 436, which is similar to interconnect structure 246 in FIG. 6a. Interconnect structure 436 is formed over semiconductor die 170, over encapsulant 210, and over stud bumps 432 after removal of a carrier, carrier tape, and a thermally releasable layer as described in relation to FIG. 5m. After removal of the carrier, carrier tape, and thermally releasable layer but before formation of interconnect structure 436, shallow laser drilling or cleaning can be applied on stud bumps 432 to clean a surface of the stud bumps and to improve contact resistance of the stud bumps. Stud bumps 432 are cleaned by removing naturally occurring oxide using RF etching, LDA, plasma clean, wet clean, or other suitable process.

Interconnect structure 436 is formed over semiconductor die 170, over encapsulant 210, and over stud bumps 432. Interconnect structure 436 includes an electrically conductive layer 438 that is similar to conductive layer 232 in interconnect structure 246. Conductive layer 438 is one or more layers of Al, Cu, Sn, Ni, Au, Ag, or other suitable electrically conductive material or alloy that does not cause delamination between stud bumps 432 and conductive layer 438. In one embodiment, conductive layer 438 includes an adhesive layer and barrier layer that is TiW, Ti, CrCu, Al, or other suitable metal or metal alloy. By forming conductive layer 438 in contact with stud bumps 432, stud bumps 432 are bonded to conductive layer 438 for subsequent electrical interconnection without a reflow step.

Accordingly, embedded SoP fan-out package 430 efficiently provides horizontal and vertical electrical interconnection for a plurality of semiconductor die embedded within a 3-D fan-out semiconductor package. Embedded SoP fan-out package 430 also provides flexibility in controlling overall package height including overall package heights less than 1 mm. An overall width and length of SoP package 434 is less than an overall width and length of embedded SoP fan-out package 430. In one embodiment, similar to the arrangement of SoP package 196 shown in FIG. 6b, both the width and length of SoP package 434 are at least 50 µm less than the width and length of embedded SoP fan-out package 430, respectively. A height of stud bumps 432 is less than or equal to a combined height of semiconductor die 170 and die attach tape 178 or die attach adhesive 190. Alternatively, a height of stud bumps 432 is slightly greater, e.g., 10 µm greater, than a combined height of semiconductor die 170 and die attach tape 178 or die attach adhesive 190. Because embedded SoP fan-out package 430 requires no additional laser drilling or other processing for the formation of 3-D vertical interconnection after completion of an RDL interconnect structure, processing time and a risk of damaging a wafer during handling for additional processing is reduced. Furthermore, by forming stud bumps as part of a BGA package and subsequently forming encapsulant around the stud bumps, package formation is simplified and made less expensive with respect to packages including bumps formed using multiple bumping processes in openings that are formed through previously provided encapsulant.

Figure 19A:
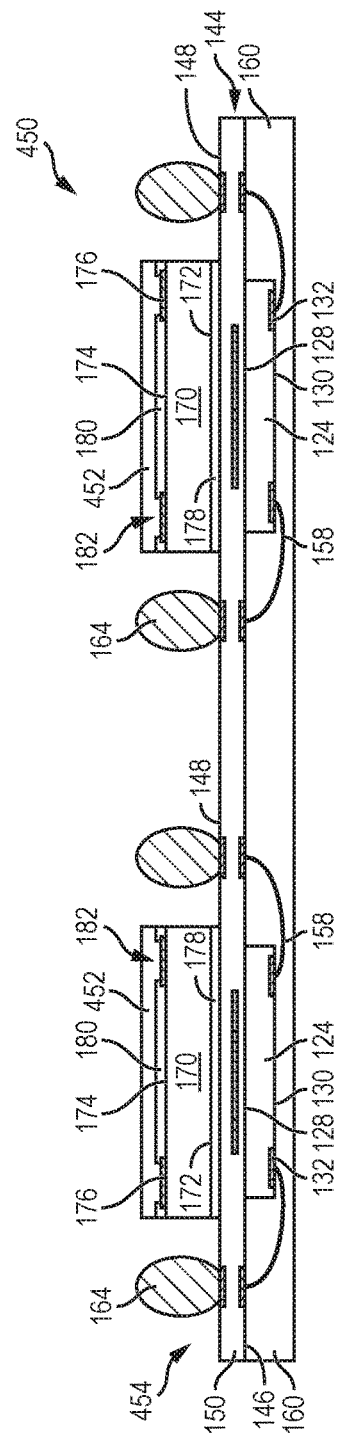

In FIGS. 19a-19i, another process of efficiently forming a 3-D SOP fan-out package including horizontal and vertical interconnections is illustrated. FIG. 19a shows SoP packages 450, similar to SoP packages 196 from FIG. 5g, with semiconductor die 170 mounted to substrate 144 with a back surface 172 of the semiconductor die oriented toward second surface 148 of substrate 144. Semiconductor die 170 include an active surface 174 opposite back surface 172. Active surface 174 includes contact pads 176 and an insulating or passivation layer 180 conformally applied over the active surface. A portion of insulating layer 180 is removed by LDA, etching, or other process to form openings in insulating layer 180 to expose contact pads 176.

An insulating or passivation layer 452 is formed over insulating layer 180 and active surface 174 of semiconductor die 170. Insulating layer 452 has a first surface that is conformally applied to, and follows the contours of, insulating layer 180 and contact pads 176. Insulating layer 452 has a second planar surface opposite the first surface. Insulating layer 452 contains one or more layers of photosensitive low curing temperature dielectric resist, photosensitive composite resist, solder mask resist film, liquid molding compound, SiO2, Si3N4, SiON, Ta2O5, Al2O3, or other material having similar insulating and structural properties. Insulating layer 452 is deposited using printing, spin coating, spray coating, lamination, or other suitable process. Insulating layer 452 is an unpatterned permanent insulation layer, or alternatively, a temporary protection layer.

Semiconductor die 170 are mounted to substrate 144 with bumps 164 disposed around a peripheral area of, and outside a footprint of, the semiconductor die. Bumps 164 are mounted to substrate 144, as described above with respect to FIG. 5d to form a SoP package panel 454 comprised of a number of ball grid array packages 450. A height of bumps 164 is determined by a final overall package height as well as other considerations. In one embodiment, after semiconductor die 170 are mounted to substrate 144, in a process similar to the process described in FIGS. 5e and 5f, substrate 144 and encapsulant 160 are singulated between bumps 164, semiconductor die 124, and semiconductor die 170 using a saw blade or laser cutting tool as shown in FIG. 5g. Singulated SoP packages 450 are then mounted to a temporary carrier with carrier tape and a thermally releasable layer using a pick and place operation, as shown in FIG. 5i, for subsequent processing as shown in FIGS. 5k-5q. Alternatively, SoP package panel 454 is not singulated immediately after the mounting of semiconductor die 170, but remains intact for subsequent processing at the panel or wafer level, as described in more detail below. By processing SoP packages 450 at the wafer level as unsingulated panel 454, a need for a temporary carrier is alleviated, thereby simplifying processing. SoP package panel 454 also includes fiducial alignment marks that facilitate the additional processing required for forming SoP packages 450 as part of a final embedded SoP fan-out package.

FIG. 19b shows an encapsulant or molding compound 458 is pre-dispensed or laminated over SoP package panel 454, around bumps 164, and around semiconductor die 170. Alternatively, transfer molding or other suitable process may be used to apply encapsulant 458. Encapsulant 458 can be polymer composite material, such as epoxy resin with filler or fiber, epoxy acrylate with filler or fiber, or polymer with proper filler or fiber. In one embodiment, the filler in encapsulant 458 includes particles with a size less than or equal to about 100 µm at either a liquid, powder, or granular phase and is selected to have a content level and characteristics that facilitate formation of the encapsulant around bumps 164 and around semiconductor die 170. The filler in encapsulant 458 is further selected to control warpage and to improve package reliability. Encapsulant 458 is dispensed on SoP package panel 454, and in one embodiment is dispensed at a central location 460 on the panel, e.g., at corners of four adjacent SoP packages 450 similar to intersection 208 shown in FIG. 5j. Encapsulant 458 is disposed over SoP package panel 454, over insulating layer 452, and over active surface 174 of semiconductor die 170, the active surface being oriented away from substrate 144 such that the encapsulant is dispensed toward insulating layer 452 and active surface 174. Thus, a reconstituted wafer or fan-out substrate 462 is formed that includes embedded SoP packages 450 and encapsulant 458. SoP packages 450 are embedded together in encapsulant 458, which is non-conductive and environmentally protects the SoP packages from external elements and contaminants.

FIG. 19c shows reconstituted wafer 462 is loaded into chase mold 464. Chase mold 464 is brought together with reconstituted wafer 462 by moving chase mold 464 around reconstituted wafer 462 and encapsulant 458, or alternatively, by moving reconstituted wafer 462 into the mold. In one embodiment, chase mold 464 includes only a first or top portion that is brought together with reconstituted wafer 462 without a second or bottom mold portion. Alternatively, reconstituted wafer 462 and encapsulant 458 are disposed within a mold including multiple portions, such as top and bottom portions. As shown in FIG. 19c, reconstituted wafer 462 is disposed within chase mold 464 without a temporary carrier, carrier tape, or a thermally releasable layer. After SoP package panel 454 and encapsulant 458 are disposed within chase mold 464, the encapsulant can be partially or completely cured. After encapsulant 458 is partially or completely cured, reconstituted wafer 462 is removed from chase mold 464.

FIG. 19d shows reconstituted wafer 462 is removed from chase mold 464. In one embodiment, a desired thickness of encapsulant 458 is formed over SoP package panel 454 such that the encapsulant does not cover active surface 174 of semiconductor die 170 and a surface of bumps 164. For example, a film assistance encapsulant process can be employed to prevent encapsulant 458 from covering active surface 174 of semiconductor die 170 and a surface of bumps 164 such that subsequent removal of encapsulant 458 is not required. Alternatively, encapsulant 458 includes a surface 468 that is disposed over and covers insulating layer 452, active surface 174 of semiconductor die 170, and a surface of bumps 164. Surface 468 of encapsulant 458 undergoes a grinding operation with grinder 470 to planarize the surface and reduce a thickness of the encapsulant to assist in controlling warpage of reconstituted wafer 462 and SoP packages 450. Alternatively, a chemical etch, LDA, or other suitable process is used to remove and planarize encapsulant 458 and to expose a surface of bumps 164, surface 472 of the encapsulant, and a surface of insulating layer 452. The exposed surface of bumps 164 can be tapered or planar. Removal of a portion of encapsulant 458 facilitates adjustment of an overall package height in accordance with a design of the final package. An additional cleaning, including shallow laser drilling, is applied on bumps 164 and insulating layer 452 to clean the surface of the bumps and the insulating layer, to more fully expose the bumps and insulating layer, and to improve contact resistance of the bumps. Additionally, bumps 164 can also be cleaned, and oxide buildup removed, using LDA with a laser, RF etching, plasma clean, or wet clean. In one embodiment, bumps 164 are Cu and naturally occurring oxide formed on copper bumps 164 is removed by RF etching.

Continuing from FIG. 19d, FIG. 19e shows unpatterned insulating layer 452 formed as an unpatterned permanent insulation layer 452a. A portion of permanent insulating layer 452a is removed by LDA, with laser 476, to form openings 478. Openings 478 are also formed by etching or other suitable process. Openings 478 extend completely through permanent insulating layer 452a to expose contact pads 176 of semiconductor die 170 and provide for subsequent electrical connection with the contact pads by the subsequent formation of an interconnect structure.

Figure 19F:
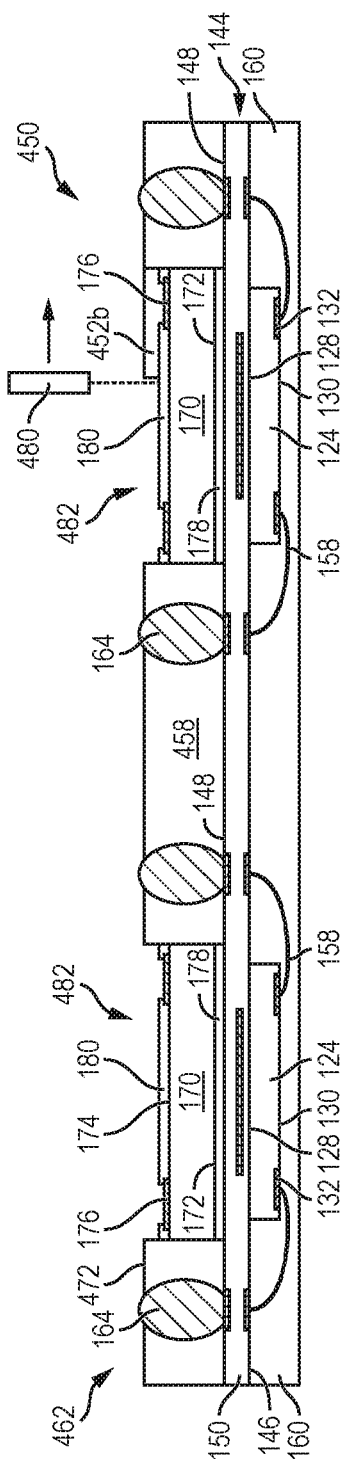

Also continuing from FIG. 19d, FIG. 19f shows unpatterned insulating layer 452 formed as a temporary protection layer 452b. Temporary protection layer 452b is removed by LDA, with laser 480, to form openings, cavities, or recesses 482. Openings 482 are also formed by the removal or stripping of temporary protection layer 452b using a solvent, etching, wet chemical etching or other suitable process. Openings 482 expose semiconductor die 170, including insulating layer 180, and contact pads 176, and provide vertical offset between insulating layer 180 and surface 472 of encapsulant 458 within a footprint of semiconductor die 170. Removal of temporary protection layer 452b also allows for subsequent electrical connection between bumps 164 and contact pads 176 by the formation of an interconnect structure.

Figure 19G:
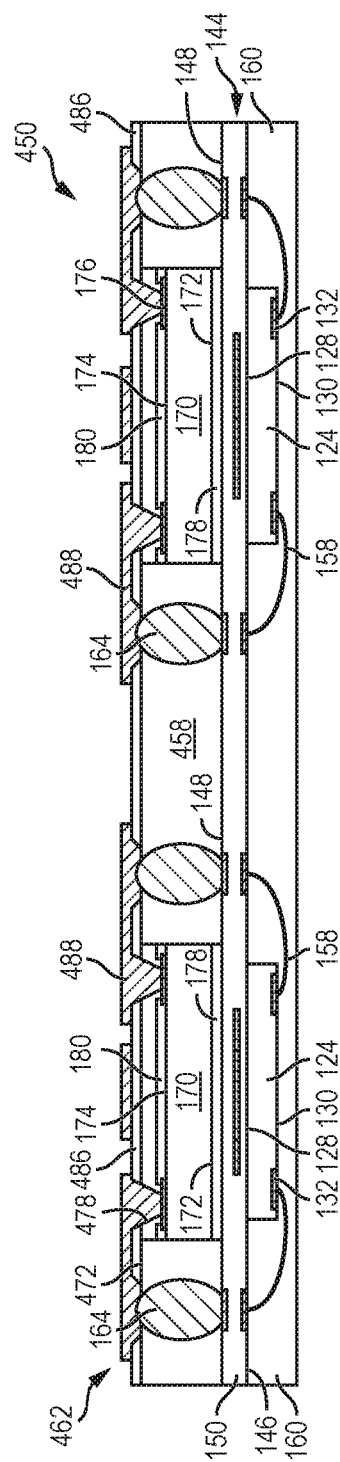

Continuing from either FIG. 19e or 19f, FIGS. 19g-19i show the formation of an interconnect structure or fan-out multi interconnection RDL similar to interconnect structure 246 described in relation to FIG. 5q. The interconnect structure of FIGS. 19g-19i provides for electrical interconnection among semiconductor die 124, semiconductor die 170, and points external to the semiconductor die through bumps 164 and contact pads 176. After the removal of at least a portion of insulating layer 452, e.g., either permanent insulation layer 452a or temporary protection layer 452b, FIG. 19g shows a first portion of the interconnect structure is formed over reconstituted wafer 462 by the deposition and patterning of insulating or passivation layer 486 and the deposition and patterning of conductive layer 488.

An insulating layer 486 is conformally applied to, and has a first surface that follows the contours of, encapsulant 458, insulating layer 452, insulating layer 180, openings 478, contact pads 176, and bumps 164. Insulating layer 486 has a second planar surface opposite the first surface. Insulating layer 486 contains one or more layers of photosensitive low curing temperature dielectric resist, photosensitive composite resist, LCP, laminate compound film, insulating paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 486 is deposited using printing, spin coating, spray coating, lamination, or other suitable process. Insulating layer 486 is subsequently patterned and cured using UV exposure followed by developing, or other suitable process. A portion of insulating layer 486 is removed by LDA, etching, or other suitable process to form openings that expose contact pads 176 of semiconductor die 170 and bumps 164. Bumps 164 and contact pads 176 can also be cleaned during or after the removal of a portion of insulating layer 486 as described previously with respect to bumps 164 in FIG. 5m or 19d.

An electrically conductive layer 488 is patterned and deposited over encapsulant 458, semiconductor die 170, insulating layer 180, and insulating layer 486. Conductive layer 488 can be one or more layers of Al, Cu, Sn, Ni, Au, Ag, or other suitable electrically conductive material or alloy that does not cause delamination between bumps 164 and conductive layer 488. In one embodiment, conductive layer 488 includes an adhesive layer and barrier layer that is a solder wettable material, e.g., CrCu, Au, TiCu alloy, Ni, or NiV alloy. The deposition of conductive layer 488 uses PVD, CVD, electrolytic plating, electroless plating, or other suitable process. Conductive layer 488 is deposited within the openings in insulating layer 486 and extends completely through the insulating layer to contact bumps 164 and contact pads 176. Accordingly, conductive layer 488 is bonded to bumps 164 for subsequent electrical interconnection without reflowing the bumps. Conductive layer 488 can also be patterned using LDA or other suitable process and operates as an RDL to extend electrical connection from semiconductor die 124 and 170 to points external to the semiconductor die.

FIG. 19h shows insulating or passivation layer 490 is conformally applied to, and follows the contours of, insulating layer 486 and conductive layer 488. Insulating layer 490 contains one or more layers of photosensitive low curing temperature dielectric resist, photosensitive composite resist, LCP, laminate compound film, insulating paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 490 is deposited using printing, spin coating, spray coating, lamination, or other suitable process. Insulating layer 490 is subsequently patterned and cured using UV exposure followed by developing, or other suitable process. A portion of insulating layer 490 is removed by LDA, etching, or other suitable process to expose portions of conductive layer 488.

An electrically conductive layer 492 is patterned and deposited over conductive layer 488, insulating layer 490, SoP packages 450, and encapsulant 458. Conductive layer 492 can be one or more layers of Al, Cu, Sn, Ni, Au, Ag, or other suitable electrically conductive material. The deposition of conductive layer 492 uses PVD, CVD, electrolytic plating, electroless plating, or other suitable process. Conductive layer 492 is disposed in openings in insulating layer 490 and extends completely through the insulating layer to contact conductive layer 488. Conductive layer 492 can also be patterned using LDA or other suitable process and operates as an RDL to extend electrical connection from semiconductor die 124 and 170, through conductive layer 488, to points external to semiconductor die 124 and 170. Additional conductive or RDL layers are added to conductive layers 488 and 492 depending on electrical signal integrity requirements and the general configuration and design of semiconductor die 124 and 176.

FIG. 19i shows insulating or passivation layer 494 is conformally applied to, and follows the contours of, insulating layer 490 and conductive layer 492. Insulating layer 494 contains one or more layers of photosensitive low temperature curing dielectric resist, photosensitive composite resist, LCP, laminate compound film, insulating paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 494 is deposited using printing, spin coating, spray coating, lamination, or other suitable process. Insulating layer 494 is subsequently patterned and cured with UV exposure followed by developing or other suitable process. A portion of insulating layer 494 is removed by LDA, etching, or other suitable process to expose portions of conductive layer 492.

An electrically conductive bump material is deposited over conductive layer 492 and insulating layer 494 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 492 using a suitable attachment or bonding process. In one embodiment, the bump material is reflowed by heating the material above its melting point to form spherical balls or bumps 496. In some applications, bumps 496 are reflowed a second time to improve electrical contact to conductive layer 492. In one embodiment, bumps 496 are formed over a UBM having a wetting layer, barrier layer, and adhesive layer. The bumps can also be compression bonded or thermocompression bonded to conductive layer 492. Bumps 496 represent one type of interconnect structure that can be formed over conductive layer 492. The interconnect structure can also use conductive paste, stud bump, micro bump, conductive columns, composite interconnects, or other electrical interconnect. Together, insulating layers 486, 490, and 494 as well as conductive layers 488, 492, and bumps 496 form interconnect structure or fan-out multi interconnection RDL 498.

Reconstituted wafer 462 and interconnect structure 498 are singulated between bumps 496, between SoP packages 450, and through encapsulant 458 and interconnect structure 498 using saw blade or laser cutting tool 500 to form embedded SoP fan-out packages 502. After completion of interconnect structure 498, SoP packages 450 do not require any additional laser drilling or other processing for the formation of 3-D vertical interconnect. After completion of interconnect structure 498 and singulation, embedded SoP fan-out packages 502 undergo a final inspection for quality control and quality assurance, and are then ready for next level assembly.

Accordingly, embedded SoP fan-out package 502 efficiently provides horizontal and vertical electrical interconnection for a plurality of semiconductor die embedded within a 3-D fan-out semiconductor package. Embedded SoP fan-out package 502 also provides flexibility in controlling overall package height. Because embedded SoP fan-out package 502 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

Figure 20:
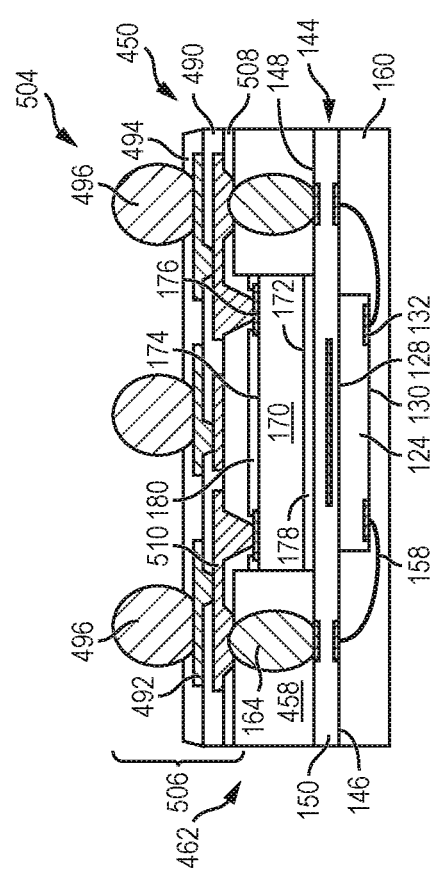
FIG. 20 illustrates another embodiment of an embedded SOP fan-out package including a cavity.

FIG. 20 shows an encapsulated SoP package 450 from FIG. 19f embedded as part of embedded SoP fan-out package 504. After the formation of encapsulant 458 and removal of temporary protection layer 452b, as described above in relation to FIG. 19f, embedded SoP fan-out package 504 is formed according to the processes outlined for SoP packages 502 as described in FIGS. 19g-19i. In embedded SoP fan-out package 504, interconnect structure 506 is formed in a process similar to the formation of interconnect structure 498. As shown in FIG. 20, interconnect structure 506 includes insulating layer 508 similar to insulating layer 486 from FIG. 19g that is conformally applied to, and has a first surface that follows the contours of, encapsulant 458, insulating layer 180, conductive layer 176, and bumps 164. Insulating layer 508 has a second planar surface opposite the first surface. Interconnect structure 506 also includes conductive layer 510 similar to conductive layer 488 from FIG. 19g that electrically connects to contact pads 176 of semiconductor die 170. Interconnect structure 506 operates to extend electrical connection from semiconductor die 124 and 170 to points external to embedded SoP fan-out package 504.

Accordingly, embedded SoP fan-out package 504 efficiently provides horizontal and vertical electrical interconnection for a plurality of semiconductor die embedded within a 3-D fan-out semiconductor package. Embedded SoP fan-out package 504 also provides flexibility in controlling overall package height. Because embedded SoP fan-out package 504 requires no additional laser drilling or other processing for the formation of 3-D vertical interconnection after completion of an RDL interconnect structure, processing time and a risk of damaging a wafer during handling for additional processing is reduced. Furthermore, by forming bumps in a single bumping process as part of a BGA package and subsequently forming encapsulant around the bumps, package formation is simplified and made less expensive with respect to packages including bumps formed using multiple bumping processes in openings that are formed through previously provided encapsulant.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a semiconductor package including a first semiconductor die and a first encapsulant disposed over the first semiconductor die;
disposing a second semiconductor die over the semiconductor package;
forming a plurality of bumps over the semiconductor package and around the second semiconductor die;
depositing a second encapsulant in contact with the semiconductor package and around the second semiconductor die and in contact with the bumps, wherein a portion of the bumps extends outward beyond the second encapsulant and an active surface of the second semiconductor die is coplanar with a surface of the second encapsulant; and
forming an interconnect structure over the second semiconductor die and second encapsulant and contacting the bumps after depositing the second encapsulant.

2. The method of claim 1, further including removing a portion of the second encapsulant.

3. The method of claim 1, further including removing a portion of the first encapsulant.

4. The method of claim 1, further including disposing a supporting layer over the second encapsulant.

5. The method of claim 1, wherein a width of the semiconductor package is substantially equal to a width of the semiconductor device.

6. A method of making a semiconductor device, comprising:
providing a first semiconductor die;
depositing a first encapsulant over the first semiconductor die;
disposing a second semiconductor die over the first semiconductor die;
forming a vertical interconnect structure around the second semiconductor die;
depositing a second encapsulant in contact with the first encapsulant and around the second semiconductor die and in contact with the vertical interconnect structure, wherein an active surface of the second semiconductor die substantially resides at a surface of the second encapsulant; and
forming an interconnect structure over the second semiconductor die and second encapsulant and contacting the vertical interconnect structure after depositing the second encapsulant.

7. The method of claim 6, wherein the vertical interconnect structure includes a plurality of bumps.

8. The method of claim 6, further including removing a portion of the second encapsulant.

9. The method of claim 6, further including removing a portion of the first encapsulant.

10. The method of claim 6, further including disposing a supporting layer over the second encapsulant.

11. The method of claim 6, wherein a height of the vertical interconnect structure is greater than a height of the second semiconductor die.

12. A method of making a semiconductor device, comprising:
provide a semiconductor package;
disposing a first semiconductor die over the semiconductor package;
forming a vertical interconnect structure over the semiconductor package and around the first semiconductor die; and
depositing a first encapsulant around the semiconductor package and further around the first semiconductor die and in contact with the vertical interconnect structure, wherein a portion of the vertical interconnect structure extends beyond the first encapsulant and a surface of the first semiconductor die substantially resides at a surface of the first encapsulant.

13. The method of claim 12, wherein providing the semiconductor package includes:
providing a second semiconductor die; and
disposing a second encapsulant over the second semiconductor die.

14. The method of claim 13, further including removing a portion of the second encapsulant.

15. The method of claim 12, further including forming an interconnect structure over the first semiconductor die and first encapsulant and contacting the vertical interconnect structure after depositing the first encapsulant.

16. The method of claim 12, further including removing a portion of the first encapsulant.

17. The method of claim 12, further including disposing a supporting layer over the first encapsulant.

18. A semiconductor device, comprising:
a semiconductor package;
a first semiconductor die disposed over the semiconductor package;
a vertical interconnect structure formed over the semiconductor package and around the first semiconductor die; and
a first encapsulant deposited around the semiconductor package and further around the first semiconductor die and in contact with the vertical interconnect structure, wherein a portion of the vertical interconnect structure extends beyond the first encapsulant and a surface of the first semiconductor die substantially resides at a surface of the first encapsulant.

19. The semiconductor device of claim 18, wherein the semiconductor package includes:
a second semiconductor die; and
a second encapsulant disposed over the second semiconductor die.

20. The semiconductor device of claim 18, further including an interconnect structure formed over the first semiconductor die and first encapsulant and electrically connected to the vertical interconnect structure.

21. The semiconductor device of claim 18, further including an opening in the first encapsulant.

22. The semiconductor device of claim 18, further including a supporting layer disposed over the first encapsulant.

23. The semiconductor device of claim 18, wherein a width of the semiconductor package is substantially equal to a width of the semiconductor device.

* * * * *